(12) United States Patent
Sugiyama et al.

(10) Patent No.: US 9,640,414 B2
(45) Date of Patent: May 2, 2017

(54) METHOD OF MANUFACTURING SEMICONDUCTOR DEVICE

(71) Applicant: Renesas Electronics Corporation, Koutou-ku, Tokyo (JP)

(72) Inventors: Michiaki Sugiyama, Kanagawa (JP); Nobuhiro Kinoshita, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/075,128

(22) Filed: Mar. 19, 2016

(65) Prior Publication Data

US 2016/0204082 A1 Jul. 14, 2016

Related U.S. Application Data

(63) Continuation of application No. 13/969,542, filed on Aug. 17, 2013, now Pat. No. 9,355,869.

(30) Foreign Application Priority Data

Aug. 31, 2012 (JP) .................................. 2012-190993

(51) Int. Cl.
*H01L 21/50* (2006.01)
*H01L 23/00* (2006.01)
(Continued)

(52) U.S. Cl.
CPC ............ *H01L 21/50* (2013.01); *H01L 21/561* (2013.01); *H01L 23/3128* (2013.01);
(Continued)

(58) Field of Classification Search
CPC ......... H01L 21/50; H01L 23/12; H01L 25/18; H01L 25/065; H01L 25/07
(Continued)

(56) References Cited

U.S. PATENT DOCUMENTS 7,528,480 B2   5/2009  Mihara
8,274,143 B2   9/2012  Fujishima et al.
(Continued)

FOREIGN PATENT DOCUMENTS

JP   2005-191053 A   7/2005
JP   2008-091638 A   4/2008
(Continued)

OTHER PUBLICATIONS

Office Action dated Dec. 8, 2015, in Japanese Patent Application No. 2012-190993.
(Continued)

*Primary Examiner* — Fernando L Toledo
*Assistant Examiner* — Adam S Bowen
(74) *Attorney, Agent, or Firm* — Shapiro, Gabor and Rosenberger, PLLC

(57) ABSTRACT

In a semiconductor device formed by mounting a chip laminate including a semiconductor chip having a small diameter and a semiconductor chip having a large diameter over the top surface of a substrate, an excessive stress is prevented from being added to a joint of the two semiconductor chips. By mounting a first semiconductor chip having a large diameter over a support substrate and thereafter mounting a second semiconductor chip having a small diameter over the first semiconductor chip, it is possible to: suppress the inclination and unsteadiness of the second semiconductor chip mounted over the first semiconductor chip; and hence inhibit an excessive stress from being added to a joint of the first semiconductor chip and the second semiconductor chip.

8 Claims, 37 Drawing Sheets

(51) Int. Cl.
*H01L 23/31* (2006.01)
*H01L 25/065* (2006.01)
*H01L 25/00* (2006.01)
H01L 21/56 (2006.01)
H01L 23/498 (2006.01)
H01L 21/683 (2006.01)
H01L 23/528 (2006.01)

(52) U.S. Cl.
CPC .............. *H01L 24/14* (2013.01); *H01L 24/19* (2013.01); *H01L 24/20* (2013.01); *H01L 24/92* (2013.01); *H01L 24/95* (2013.01); *H01L 24/96* (2013.01); *H01L 24/97* (2013.01); *H01L 25/0657* (2013.01); *H01L 25/50* (2013.01); H01L 21/56 (2013.01); H01L 21/563 (2013.01); H01L 21/6836 (2013.01); H01L 23/49833 (2013.01); H01L 23/5283 (2013.01); H01L 24/13 (2013.01); H01L 24/16 (2013.01); H01L 24/17 (2013.01); H01L 24/27 (2013.01); H01L 24/32 (2013.01); H01L 24/33 (2013.01); H01L 24/81 (2013.01); H01L 24/83 (2013.01); H01L 24/94 (2013.01); H01L 2221/68327 (2013.01); H01L 2224/0401 (2013.01); H01L 2224/04105 (2013.01); H01L 2224/05023 (2013.01); H01L 2224/05025 (2013.01); H01L 2224/0557 (2013.01); H01L 2224/05073 (2013.01); H01L 2224/05147 (2013.01); H01L 2224/05611 (2013.01); H01L 2224/05655 (2013.01); H01L 2224/12105 (2013.01); H01L 2224/131 (2013.01); H01L 2224/13111 (2013.01); H01L 2224/13144 (2013.01); H01L 2224/13147 (2013.01); H01L 2224/14131 (2013.01); H01L 2224/14135 (2013.01); H01L 2224/14136 (2013.01); H01L 2224/14181 (2013.01); H01L 2224/16145 (2013.01); H01L 2224/16146 (2013.01); H01L 2224/16225 (2013.01); H01L 2224/16227 (2013.01); H01L 2224/17181 (2013.01); H01L 2224/214 (2013.01); H01L 2224/215 (2013.01); H01L 2224/2731 (2013.01); H01L 2224/27334 (2013.01); H01L 2224/32145 (2013.01); H01L 2224/32225 (2013.01); H01L 2224/33181 (2013.01); H01L 2224/73104 (2013.01); H01L 2224/73204 (2013.01); H01L 2224/73253 (2013.01); H01L 2224/73259 (2013.01); H01L 2224/81191 (2013.01); H01L 2224/81447 (2013.01); H01L 2224/81801 (2013.01); H01L 2224/82105 (2013.01); H01L 2224/82106 (2013.01); H01L 2224/83104 (2013.01); H01L 2224/83191 (2013.01); H01L 2224/83192 (2013.01); H01L 2224/83862 (2013.01); H01L 2224/92224 (2013.01); H01L 2224/92242 (2013.01); H01L 2224/92244 (2013.01); H01L 2224/94 (2013.01); H01L 2224/95 (2013.01); H01L 2224/96 (2013.01); H01L 2224/97 (2013.01); H01L 2225/06513 (2013.01); H01L 2225/06517 (2013.01); H01L 2225/06541 (2013.01); H01L 2225/06544 (2013.01); H01L 2225/06568 (2013.01); H01L 2225/06586 (2013.01); H01L 2924/00014 (2013.01); H01L 2924/12042 (2013.01); H01L 2924/13091 (2013.01); H01L 2924/15311 (2013.01); H01L 2924/15313 (2013.01); H01L 2924/181 (2013.01); H01L 2924/3511 (2013.01)

(58) Field of Classification Search
USPC .......................................................... 438/107
See application file for complete search history.

(56) References Cited

U.S. PATENT DOCUMENTS

| 8,354,340 | B2 | 1/2013 | Kurita et al. |
| 2004/0171193 | A1 | 9/2004 | Hayashida |
| 2005/0140023 | A1 | 6/2005 | Kinoshita et al. |
| 2010/0258932 | A1* | 10/2010 | Yoshida ................ H01L 21/561 257/686 |
| 2011/0309495 | A1 | 12/2011 | Wang et al. |

FOREIGN PATENT DOCUMENTS

| JP | 2010-166095 A | 7/2010 |
| JP | 2010-251408 A | 11/2010 |
| JP | 2011-187574 A | 9/2011 |
| JP | 2011-243800 A | 12/2011 |

OTHER PUBLICATIONS

Office Action issued Dec. 1, 2016 in Taiwanese Patent Application No. 102129184.

* cited by examiner

METHOD OF MANUFACTURING SEMICONDUCTOR DEVICE

CROSS-REFERENCE TO RELATED APPLICATIONS

The disclosure of Japanese Patent Application No. 2012-190993 filed on Aug. 31, 2012 including the specification, drawings and abstract is incorporated herein by reference in its entirety.

BACKGROUND

The present invention relates to a method of manufacturing a semiconductor device and to a technology effectively applicable to the manufacture of a semiconductor device formed by mounting a chip laminate including a small-diameter semiconductor chip and a large-diameter semiconductor chip over the top surface of a substrate for example.

Patent Literature 1 discloses a SIP (System In Package) type semiconductor device formed by mounting a controller chip over the top surface of a wiring substrate and laminating a memory chip over the top surface of the controller chip. The controller chip to control the memory chip is mounted over the top surface of the wiring substrate by flip-chip (face-down) bonding through bump (protrusion) electrodes and the gap between the wiring substrate and the controller chip is filled with an adhesive agent. Meanwhile, the memory chip is mounted over the top surface of the controller chip by face-up bonding through an adhesive agent and electrode pads (bonding pads) of the memory chip are electrically connected with electrode pads (bonding leads) of the wiring substrate through wires.

Patent Literatures 2 and 3 disclose a COC (Chip On Chip) type semiconductor device formed by mounting a plurality of semiconductor chips (a chip laminate) between a metal substrate and a wiring substrate which are arranged oppositely. The semiconductor chips configuring the chip laminate: include a plurality of memory chips and an interface chip to control the memory chips; and are electrically connected with each other through through-vias formed by penetrating the semiconductor chips and bump electrodes formed at both the ends of the through-vias. In the chip laminate, the interface chip having a smaller area than the memory chips is arranged at a position nearest to the wiring substrate and bump electrodes of the interface chip are electrically connected with electrode pads of the wiring substrate through wire bumps.

PREVIOUS TECHNICAL LITERATURE

Patent Literature

[Patent Literature 1] Japanese Unexamined Patent Publication No. 2005-191053
[Patent Literature 2] Japanese Unexamined Patent Publication No. 2011-187574
[Patent Literature 3] Japanese Unexamined Patent Publication No. 2010-251408

SUMMARY

When such a chip laminate structure as disclosed in Patent Literatures 2 and 3 is produced, if it is intended to firstly mount a first semiconductor chip over the top surface of a substrate (wiring substrate) and secondly laminate a second semiconductor chip having a larger diameter than the first semiconductor chip over the first semiconductor chip, an arising problem is difficulty in assembly including that the second semiconductor chip inclines to the underlying first semiconductor chip.

Other problems and novel features will be obvious from the descriptions and attached drawings in the present specification.

The representative gist of the means for solving the problems disclosed in the present application is briefly explained as follows.

A method of manufacturing a semiconductor device according to an embodiment of the present application includes the following steps of:

(a) mounting, over a support substrate, a first semiconductor chip having a first main surface, a first main surface pad formed on the first main surface, and a first conductive member formed over the first main surface pad, such that a first back surface opposite to the first main surface faces to the support substrate;

(b) after the step (a), mounting a second semiconductor chip over the first main surface of the first semiconductor chip such that a second back surface faces to the first main surface of the first semiconductor chip, and electrically connecting the first main surface pad of the first semiconductor chip with a second back surface pad of the second semiconductor chip through the first conductive member, the second semiconductor chip having a second main surface, a second main surface pad formed over the second main surface, a second conductive member formed over the second main surface pad, and the second back surface pad formed on the second back surface opposite to the second main surface and electrically connected with the second main surface pad and having smaller external dimensions than the first semiconductor chip;

(c) after the step (b), sealing the first semiconductor chip, the second semiconductor chip, and the second conductive member with a sealing material;

(d) after the step (c), fixing, with the sealing material, a base substrate having a third surface, a plurality of bonding leads formed over the third surface, and a plurality of bump lands formed over a fourth surface opposite to the third surface, such that the third surface faces to the support substrate, and electrically connecting the bonding lead of the base substrate with the second conductive member of the second semiconductor chip; and (e) after the step (d), arranging an external terminal at each of the plural bump lands of the base substrate.

The representative effects obtained by the invention disclosed in the present application are briefly explained as follows.

By mounting a second semiconductor chip having smaller external dimensions than a first semiconductor chip over the first semiconductor chip after mounting the first semiconductor chip over a support substrate, it is possible to: suppress the inclination and unsteadiness of the second semiconductor chip mounted over the first semiconductor chip; and hence inhibit an excessive stress from being added to a joint of the first semiconductor chip and the second semiconductor chip.

DETAILED DESCRIPTION

Figure 1:
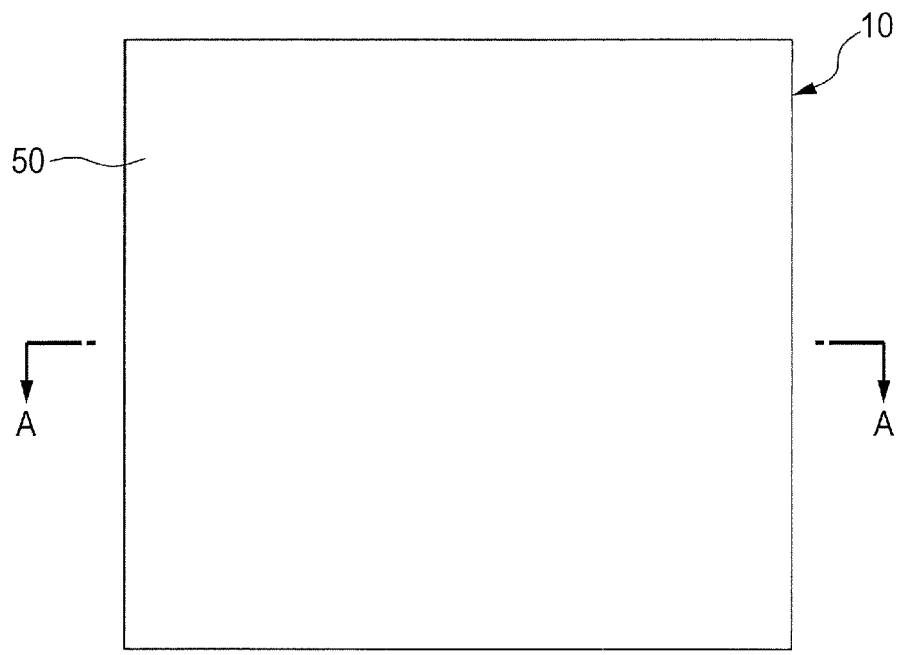
FIG. 1 is a plan view on the top surface side of a semiconductor device according to Embodiment 1.

Embodiments according to the present invention are hereunder explained in detail in reference to drawings. Here, in all the drawings for explaining the embodiments, members having an identical function are represented with an identical code and are not explained repeatedly. Further, in the embodiments, identical or similar parts are not explained repeatedly in principle unless it is particularly needed. Furthermore, in the drawings for explaining the embodiments, hatching may sometimes be applied even in a plan view or omitted even in a sectional view in order to make a configuration easy to understand.

(Embodiment 1)

<Semiconductor Device>

Figure 2:
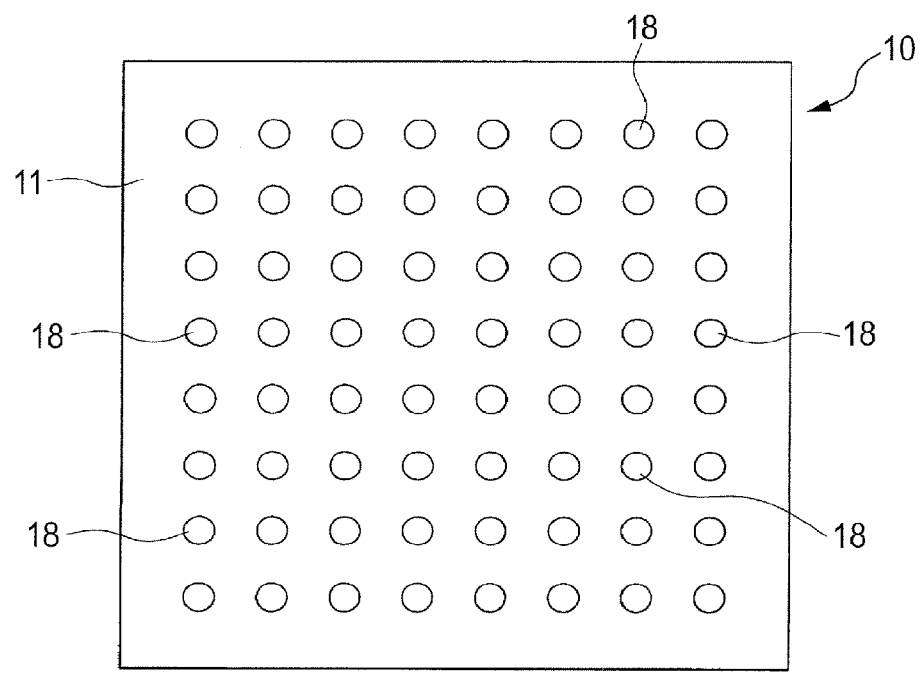
FIG. 2 is a plan view on the back surface side of a semiconductor device according to Embodiment 1.
Figure 3:
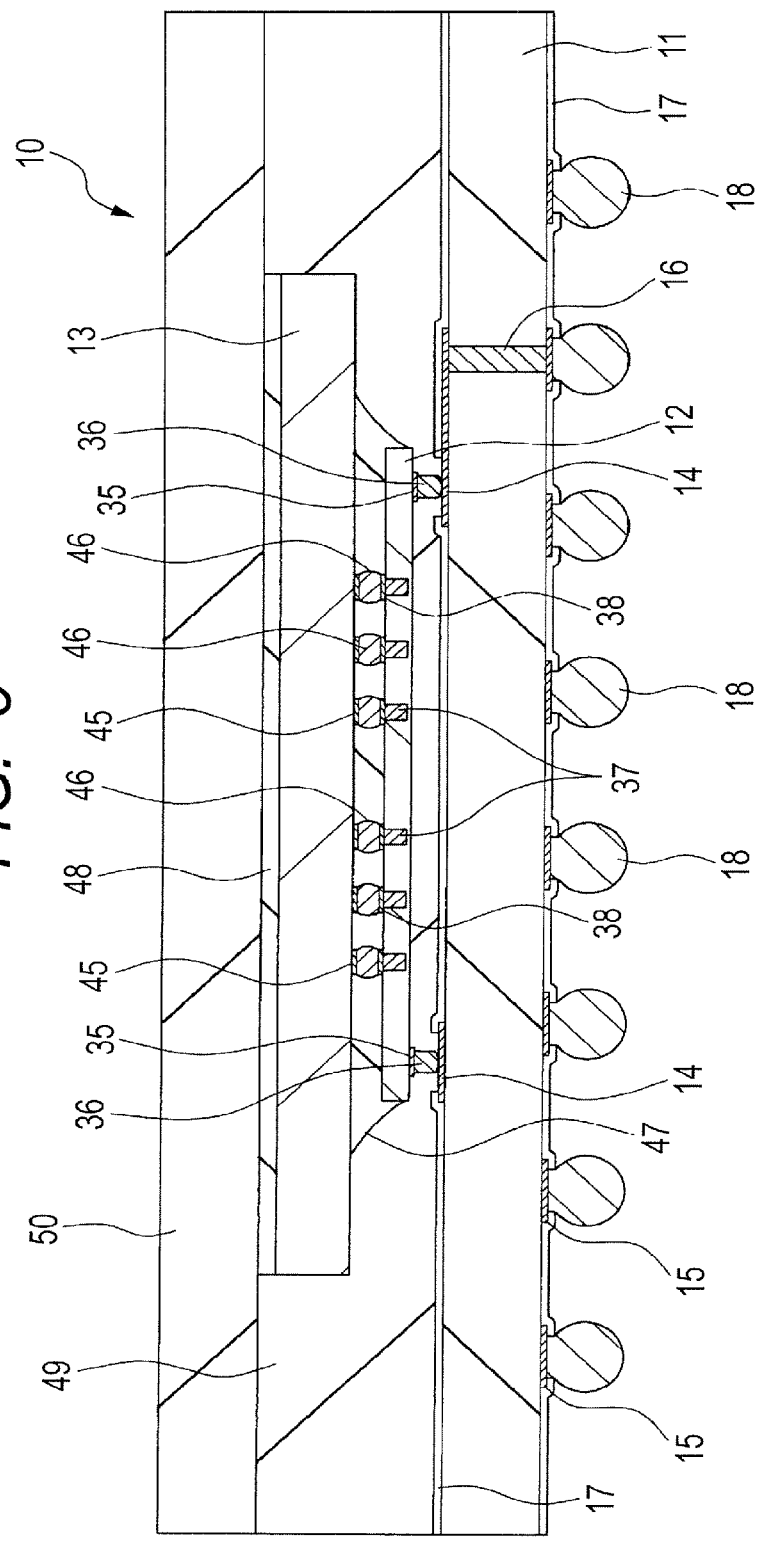
FIG. 3 is a sectional view taken on line A-A of FIG. 1.

FIG. 1 is a plan view on the top surface side of a semiconductor device according to Embodiment 1. FIG. 2 is a plan view on the back surface side of the semiconductor device. FIG. 3 is a sectional view taken on line A-A of FIG. 1.

A semiconductor device 10 according to Embodiment 1 is a SIP (System In Package) type semiconductor device formed by mounting a chip laminate comprising two semiconductor chips (a microcomputer chip 12 and a memory chip 13) over a base substrate (base material) 11.

The base substrate 11 is a so-called bilayer wiring substrate having an insulating member formed by impregnating a synthetic resin such as an epoxy resin into glass fiber or carbon fiber and two wiring layers formed over both the surfaces of the insulating member for example. The planar shape of the base substrate 11 is a quadrangle and the external dimensions thereof are 14 mm in length, 14 mm in width, and 0.22 mm in thickness for example.

The two wiring layers include a plurality of bonding leads (electrode pads) 14 formed over a chip-mounting surface of the base substrate 11 (a top surface of the base substrate 11 in FIG. 3) and a plurality of bump lands (electrode pads) 15 formed over a back surface (mounting surface) of the base substrate 11. The bonding leads 14 and the bump lands 15 include a copper (Cu) film and a plated film formed over the surface thereof for example. The plated film includes a metal film containing tin (Sn) as a main component for example. The main component means a primary material configuring a metal film and includes the case of containing fine impurities and another metallic material in the interior of the metal film.

Further, each of the bonding leads 14 is electrically connected with each of the bump lands 15 through a through-hole wiring 16 formed in the interior (insulating member) of the base substrate 11. Furthermore, the chip-mounting surface and the back surface of the base substrate 11 are covered with solder resists insulating films) 17 except the regions where the electrode pads (bonding leads 14 and bump lands 15) are formed.

The microcomputer chip 12 is mounted over the chip-mounting surface of the base substrate 11. The microcomputer chip 12 is mounted over the chip-mounting surface of the base substrate 11 such that the main surface thereof may be opposed to the base substrate 11.

Figure 4:
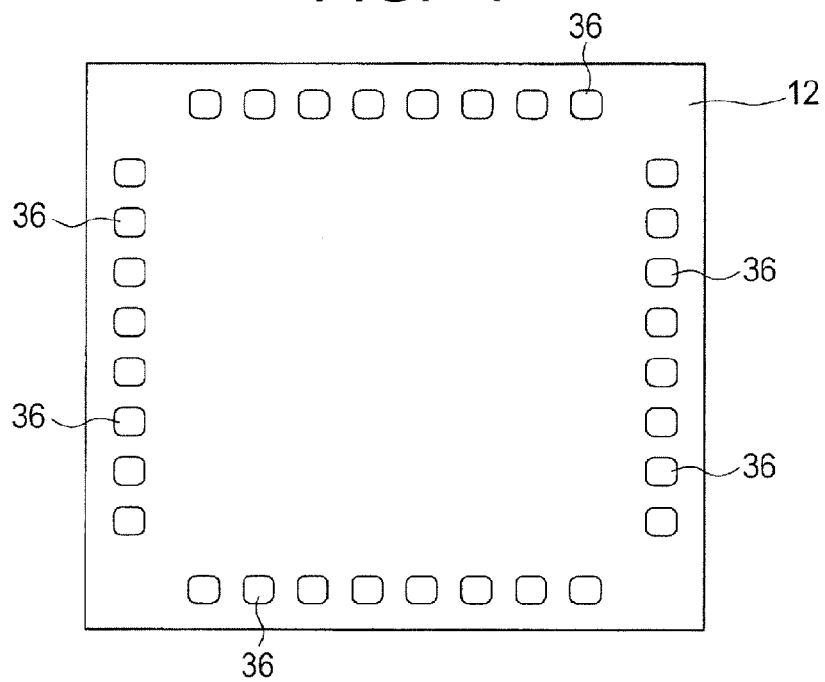
FIG. 4 is a plan view on the main surface side of a microcomputer chip.
Figure 5:
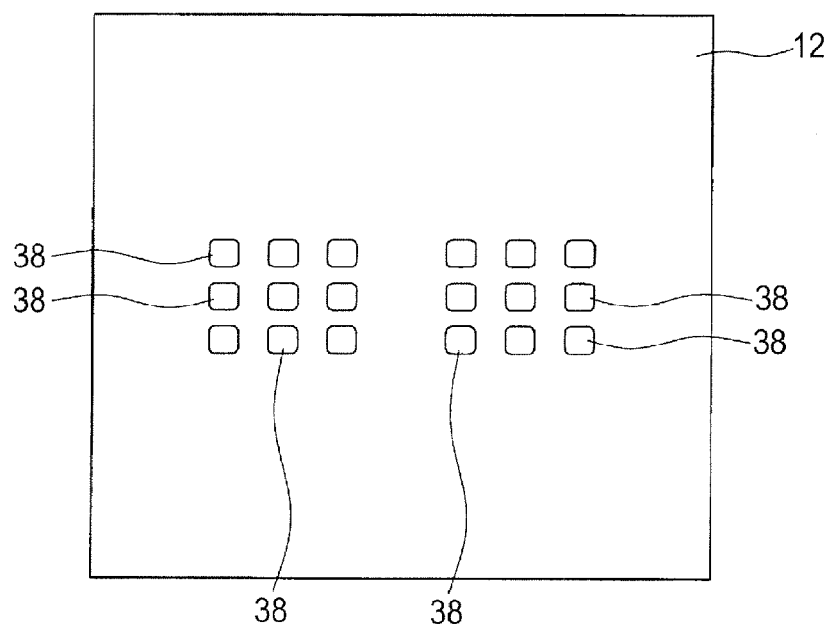
FIG. 5 is a plan view on the back surface side of microcomputer chip.
Figure 6:
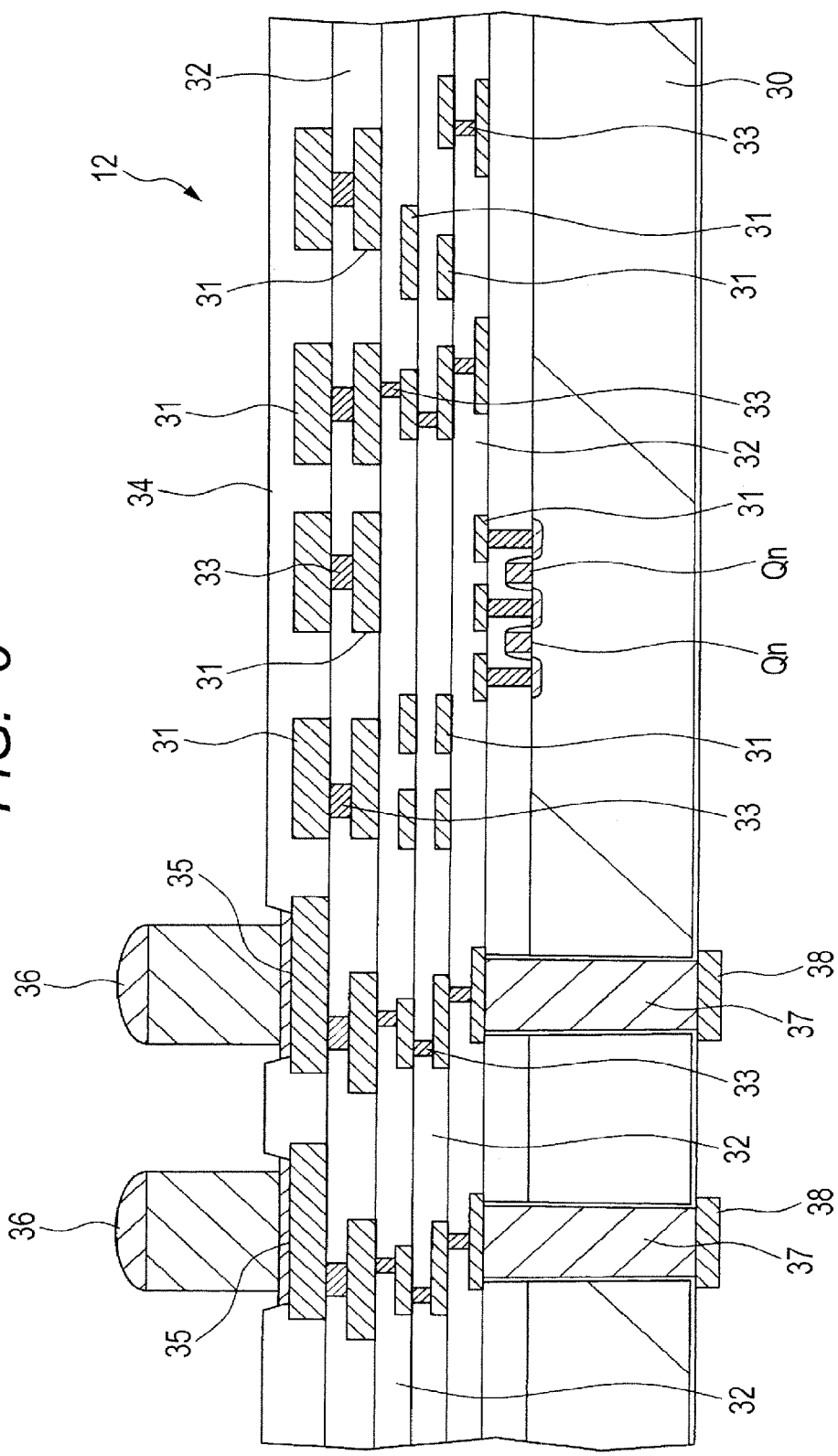
FIG. 6 is a partially-expanded sectional view of microcomputer chip.

FIG. 4 is a plan view on the main surface side of the microcomputer chip 12. FIG. 5 is a plan view on the back surface side of the microcomputer chip 12. FIG. 6 is a partially-expanded sectional view of the microcomputer chip 12.

The planar shape of the microcomputer chip 12 is a quadrangle and the external dimensions thereof are 6 mm in length, 6 mm in width, and 50 µm in thickness for example. The microcomputer chip 12 has a silicon substrate 30 of a p-type for example as shown in FIG. 6. Further, a plurality of n-channel type MOS transistors (Qn) configuring circuit elements (second semiconductor elements) of a logic circuit are formed over the main surface of the silicon substrate 30. That is, the microcomputer chip 12 according to the present embodiment is a semiconductor chip to control the memory chip 13. Here, other circuit elements (semiconductor elements) configuring the logic circuit such as a p-channel type MOS transistor are further formed over the main surface of the silicon substrate 30 but the drawings thereof are omitted.

Multilayered wirings 31 to couple a circuit element to another circuit element are formed at the upper part of the circuit elements. The wirings 31 include metal films of copper (Cu) or aluminum (Al) for example. Further, multi-layered interlayer insulating films 32 comprising silicon oxide films or the like are formed between the circuit elements and the wirings 31 and between the wirings 31 of lower layers and the wirings 31 of upper layers. Furthermore, a plurality of contact layers 33 to electrically connect the circuit elements with the wirings 31 and the wirings 31 of lower layers to the wirings 31 of upper layers are formed in the interlayer insulating films 32.

A surface protective film (passivation film) 34 to protect the logic circuit is formed at the uppermost layer over the main surface of the microcomputer chip 12. The surface protective film 34 is comprised of an insulating film formed by laminating a silicon oxide film and a silicon nitride film for example. Further, a plurality of main surface pads (electrode pads) 35 formed by opening parts of the surface protective film 34 and exposing parts of the wirings 31 are formed at the uppermost layer of the microcomputer chip 12.

A bump electrode 36 of a pillar shape is formed over the surface of each of the main surface pads 35. A bump electrode 36 is comprised of a metal film formed by laminating a copper (Cu) film and a solder film comprising a tin (Sn)-silver (Ag) alloy in sequence from the side closer to a main surface pad 35 for example.

The main surface pads 35 formed over the main surface of the microcomputer chip 12 and the bump electrodes 36 formed over the surfaces thereof are arranged in a row along the four sides of the microcomputer chip 12 as shown in FIG. 4. Then the microcomputer chip 12 is electrically connected with the bonding leads 14 of the base substrate 11 through the bump electrodes 36 as shown in FIG. 3.

As shown in FIG. 6, a plurality of through-vias 37 reaching the wirings 31 from the back surface of the microcomputer chip 12 are formed in the silicon substrate 30 of the microcomputer chip 12. Each of the through-vias 37 is formed by embedding a copper (Cu) film into a through-hole opening in the silicon substrate 30 for example. Further, back surface pads 38 electrically connected with the through-vias 37 respectively are formed over the back surface of the microcomputer chip 12. Each of the back surface pads 38 is comprised of a copper (Cu) film and a plated film formed over the surface thereof for example. The plated film is comprised of a metal film containing tin (Sn) as a main component for example.

In this way, the circuit elements formed in the microcomputer chip 12 are electrically connected with the bump electrodes 36 over the main surface of the microcomputer chip 12 through the wirings 31, the contact layers 33, and the main surface pads 35. Further, the circuit elements are electrically connected with the back surface pads 38 over the back surface of the microcomputer chip 12 through the wirings 31, the contact layers 33, and the through-vias 37.

The memory chip 13 is mounted over the back surface of the microcomputer chip 12 as shown in FIG. 3. The memory chip 13 is mounted over the back surface of the microcomputer chip 12 such that the main surface thereof may be opposed to the back surface of the microcomputer chip 12.

Further, the gap between the back surface of the microcomputer chip 12 and the main surface of the memory chip 13 is filled with an adhesive agent 47. In Embodiment 1, as the adhesive agent 47, an NCF (Non Conductive Film) that is a kind of a thermosetting resin film or an NCP (Non Conductive Paste) that is a kind of a thermosetting resin paste is used.

Here, the NCF: is stipulated by Semiconductor Equipment Association of Japan (SEAJ) which is a general incorporated association; is a connecting material having the shape of a film which is used for fixing (cementing) a semiconductor chip or adhering an electrode surface (main surface) of a semiconductor chip to a circuit surface (chip-mounting surface) of a substrate (wiring substrate); and has not only the function of an underfill material but also the function of adhesion/insulation simultaneously.

The NCP, like the NCF, is a connecting material which is used for fixing (cementing) a semiconductor chip and has not only the function of an underfill material but also the function of adhesion/insulation simultaneously. Whereas the NCF is a material processed into the shape of a film beforehand, the NCP is a pasty material and a material hardened by heating after injected into a gap between a semiconductor chip and a substrate or the like. An advantage thereof is that the fluidity is higher than that of the NCF and hence even a narrow gap can be filled with it easily.

Figure 7:
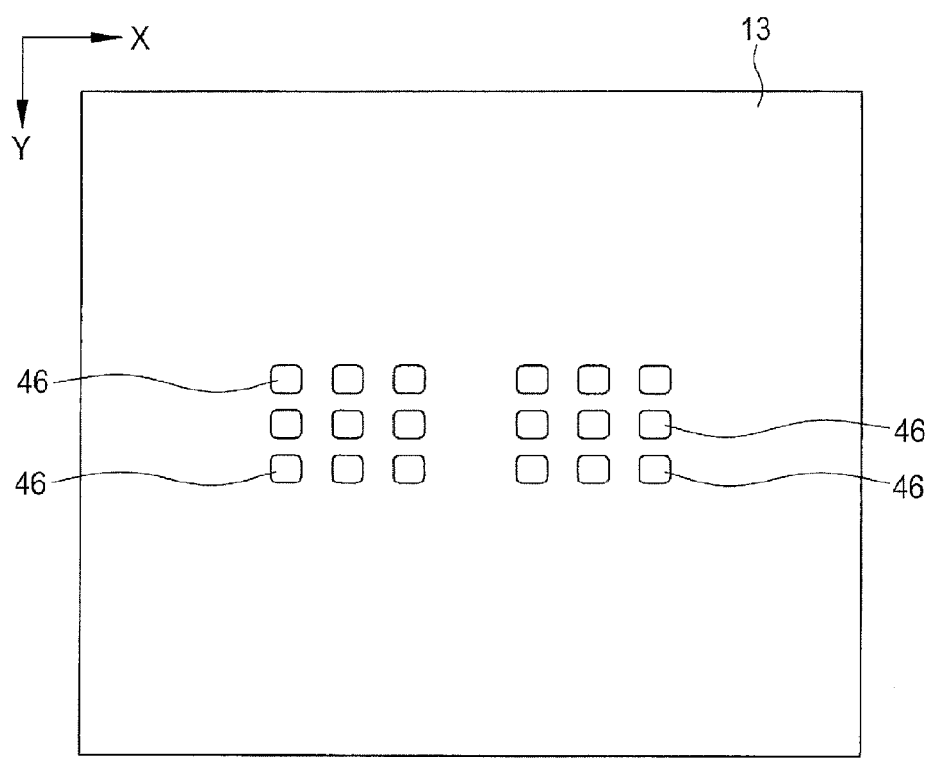
FIG. 7 is a plan view on the main surface side of memory chip.
Figure 8:
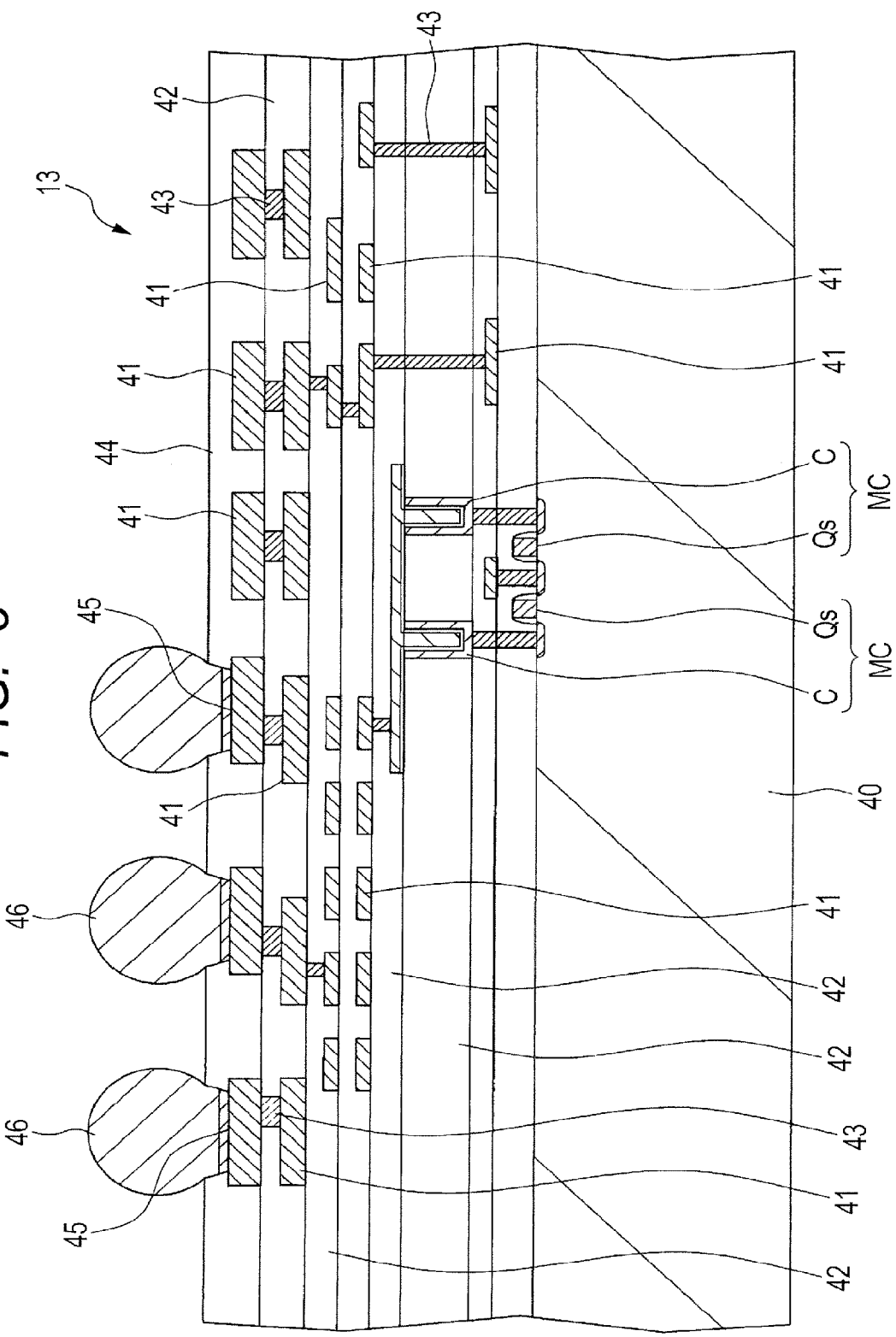
FIG. 8 is a partially-expanded sectional view of a memory chip.

FIG. 7 is a plan view on the main surface side of the memory chip 13. FIG. 8 is a partially-expanded sectional view of the memory chip 13.

The planar shape of the memory chip 13 is a quadrangle and the external dimensions thereof are 92 mm in length, 8.6 mm in width, and 260 μm in thickness for example. That is, the external dimensions of the memory chip 13 mounted over the back surface of the microcomputer chip 12 are larger than the external dimensions (6 mm in length and 6 mm in width) of the microcomputer chip 12.

The memory chip 13 has a silicon substrate 40 of a p-type as shown in FIG. 8 for example. Memory cells (MCs) of DRAMs (Dynamic Random Access Memories) that are kinds of semiconductor memories are formed over the main surface of the silicon substrate 40. Each of the DRAM memory cells (MCs) includes a memory tell selection MOS transistor (Qs) and an information storage capacitive element (C) coupled to the memory cell selection MOS transistor (Qs) in series. Here, other circuit elements (semiconductor elements) configuring DRAM circuits (a memory cell array and peripheral circuits) are further formed over the main surface of the silicon substrate 40 but the drawings thereof are omitted. Further, although explanations have been made on the basis of the memory chip 13 having DRAM circuits in the present embodiment, the circuits formed over the memory chip 13 may also be flash memory circuits or other memory circuits.

Multilayered wirings 41 to couple a circuit element to another circuit element are formed at the upper part of the circuit elements. Further, multilayered interlayer insulating films 42 are formed between the circuit elements and the wirings 41 and between the wirings 41 of lower layers and the wirings 41 of upper layers. Furthermore, a plurality of contact layers 43 to electrically connect the circuit elements with the wirings 41 and the wirings 41 of lower layers to the wirings 41 of upper layers are formed in the interlayer insulating films 42.

A surface protective film (passivation film) 44 to protect the DRAM circuits is formed as the uppermost layer over the main surface of the memory chip 13. Further, a plurality of main surface pads (electrode pads) 45 formed by opening parts of the surface protective film 44 and exposing parts of the wirings 41 are formed at the uppermost layer of the memory chip 13.

A bump electrode 46 of a ball (spherical) shape is formed over the surface of each of the main surface pads 45. Each of the bump electrodes 46 is comprised of a metal film formed by laminating a copper (Cu) film, a nickel (Ni) film, and a solder film comprising a tin (Sn)-silver (Ag) alloy in sequence from the side closer to a main surface pad 45 for example.

The main surface pads 45 formed over the main surface of the memory chip 13 and the bump electrodes 46 formed over the surfaces thereof are arranged at the center part of the short sides of the memory chip 13 (sides in the Y direction in FIG. 7) and formed along the long sides (sides in the X direction in FIG. 7) as shown in FIG. 7. Then the memory chip 13 is electrically connected with the back surface pads 38 of the microcomputer chip 12 through the bump electrodes 46 as shown in FIG. 3.

Although the figures are simplified, the number of the main surface pads 45 formed over the main surface of the memory chip 13 is about 1,200 and the main surface pads 45 are arranged so as to form a layout of 4 rows in the Y direction each of which includes about 300 pieces along the long side (X direction) of the memory chip 13 for example.

Then the distances between the main surface pads 45 adjacent to each other are 40 μm in the short side direction (Y direction) and 50 μm in the long side direction (X direction) of the memory chip 13. That is, the memory chip 13 has a larger number of input-output pins (main surface pads 45) than ordinary DRAM chips in order to increase a data transmission speed by expanding a bus width. Consequently, the number of the back surface pads 38 of the microcomputer chip 12 electrically connected with the main surface pads 45 of the memory chip 13 through the bump electrodes 46 is also about 1,200.

As shown in FIG. 3, the back surface of the memory chip 13 is fixed to a chip-mounting surface of a sub-substrate (support substrate) 50 (a back surface of the sub-substrate 50 in FIG. 3) through an adhesive agent 48. The sub-substrate 50 is comprised of a flat synthetic resin plate for example and the external dimensions thereof are identical to the external dimensions of the base substrate 11 (14 mm in length and 14 mm in width for example). Further, the adhesive agent 48 is a filmy adhesive agent being called a die attach film (DAF) for example and having both the functions of a die bond and a dicing tape.

The sub-substrate 50 is a substrate to support the memory chip 13 and hence no wiring layer is formed. Here, the sub-substrate 50 can include a material other than a synthetic resin plate, such as a board of glass, ceramics, or metal.

The two semiconductor chips (the microcomputer chip 12 and the memory chip 13) interposed between the sub-substrate 50 and the base substrate 11 are airtightly sealed with a sealing material 49 applied to the gap between the sub-substrate 50 and the base substrate 11.

In Embodiment 1, the aforementioned NCF is used as the sealing material 49. Further, the NCP can also be used instead of the NCF. In consideration of sticking to the base substrate 11 however, a filmy sealing material that is likely to obtain better flatness than a pasty sealing material is preferably used in the case of the sealing material 49.

Meanwhile, a solder ball (solder material) 18 configuring an external terminal of the semiconductor device 10 is coupled to the surface of each of the bump lands 15 formed over the back surface (mounting surface) of the base substrate 11. The semiconductor device 10 according to Embodiment 1 is mounted over a mounting substrate (mother board) not shown in the figure through those solder balls 18. That is, the base substrate 11 of the semiconductor device 10 functions as an interposer substrate to couple the two semiconductor chips (the microcomputer chips 12 and the memory chips 13) mounted over the chip-mounting surface thereof to the mounting substrate (mother board).

The solder balls 18 are comprised of so-called lead-free solder substantially not containing lead (Pb), such as only tin (Sn), tin-bismuth (Sn—Bi) alloy, or tin-copper-silver (Sn—Cu—Ag) alloy for example.

In this way, the semiconductor device 10 according to Embodiment 1 electrically connects the microcomputer chip 12 with the base substrate 11 through the bump electrodes 36 formed over the main surface pads 35 of the microcomputer chip 12 and electrically connects the memory chip 13 with the microcomputer chip 12 through the bump electrodes 46 formed over the main surface pads 45 of the memory chip 13. As a result, it is possible to minimize the length of a data transmission path to electrically connect the base substrate 11 with the memory chip 13 through the microcomputer chip 12 and hence it is possible to increase a data transmission speed.

Meanwhile, the present inventors have studied a method of manufacturing a SIP type semiconductor device formed by mounting a chip laminate comprised of a microcomputer chip 12 and a memory chip 13 over a base substrate 11 like the semiconductor device 10 according to Embodiment 1.

Generally a microcomputer chip (a semiconductor chip to control a memory chip) of a SIP type semiconductor device has an external interface circuit to input signals from and output signals to an external device and an internal interface circuit to input signals from and output signals to an internal device (here a memory chip). Consequently, it is preferable to adopt a configuration of arranging a microcomputer chip on the side closer to a base substrate (wiring substrate) and laminating a memory chip over the microcomputer chip in order to shorten the length of a data transmission path coupling the base substrate to a chip laminate and materialize the high-speed operation of a SIP type semiconductor device.

Further, generally in the manufacturing step of a semiconductor chip, the improvement of manufacturing efficiency and the reduction of manufacturing cost are attempted by reducing the external dimensions of the semiconductor chip and increasing the number of chips obtained from a semiconductor wafer. For the purpose the external dimensions of microcomputer chip tend to decrease year by year. In the case of a memory chip however the external dimensions tend to increase year by year in association with increasing demand of a larger capacity and external dimensions exceeding at least 6 mm in length and 6 mm in, width become, common in recent years. That is, the difference between the external dimensions of microcomputer chip and the external dimensions of a memory chip is expanding year by year.

In the manufacturing step of a SIP type semiconductor device therefore if a memory chip of a large diameter is laminated over a microcomputer chip of a small diameter after the microcomputer chip is mounted over a base substrate (wiring substrate) the proportion of the memory chip hanging over the microcomputer chip increases and the inclination and unsteadiness of the memory chip are likely to be caused. As a result, an excessive stress is added to a joint of the microcomputer chip and the memory chip, thus the reliability of the joint of the two chips deteriorates, cracks are generated at the overhung part of the memory chip, and thus the deteriorations of the reliability and the manufacturing yield of the SIP type semiconductor device are caused.

In view of the above situation, in Embodiment 1, a SIP type semiconductor device 10 is manufactured by the method explained hereunder.

<Method of Manufacturing Semiconductor Device>

A method of manufacturing a semiconductor device 10 according to Embodiment 1 is explained hereunder in accordance with the sequence of steps in reference to drawings.

1. Preparation Step of Substrates and Chips

FIG. 9A is a plan view showing a chip-mounting surface of a large substrate used for manufacturing a semiconductor device according to Embodiment 1 and FIG. 9B is a sectional view of the large substrate.

Figure 9:
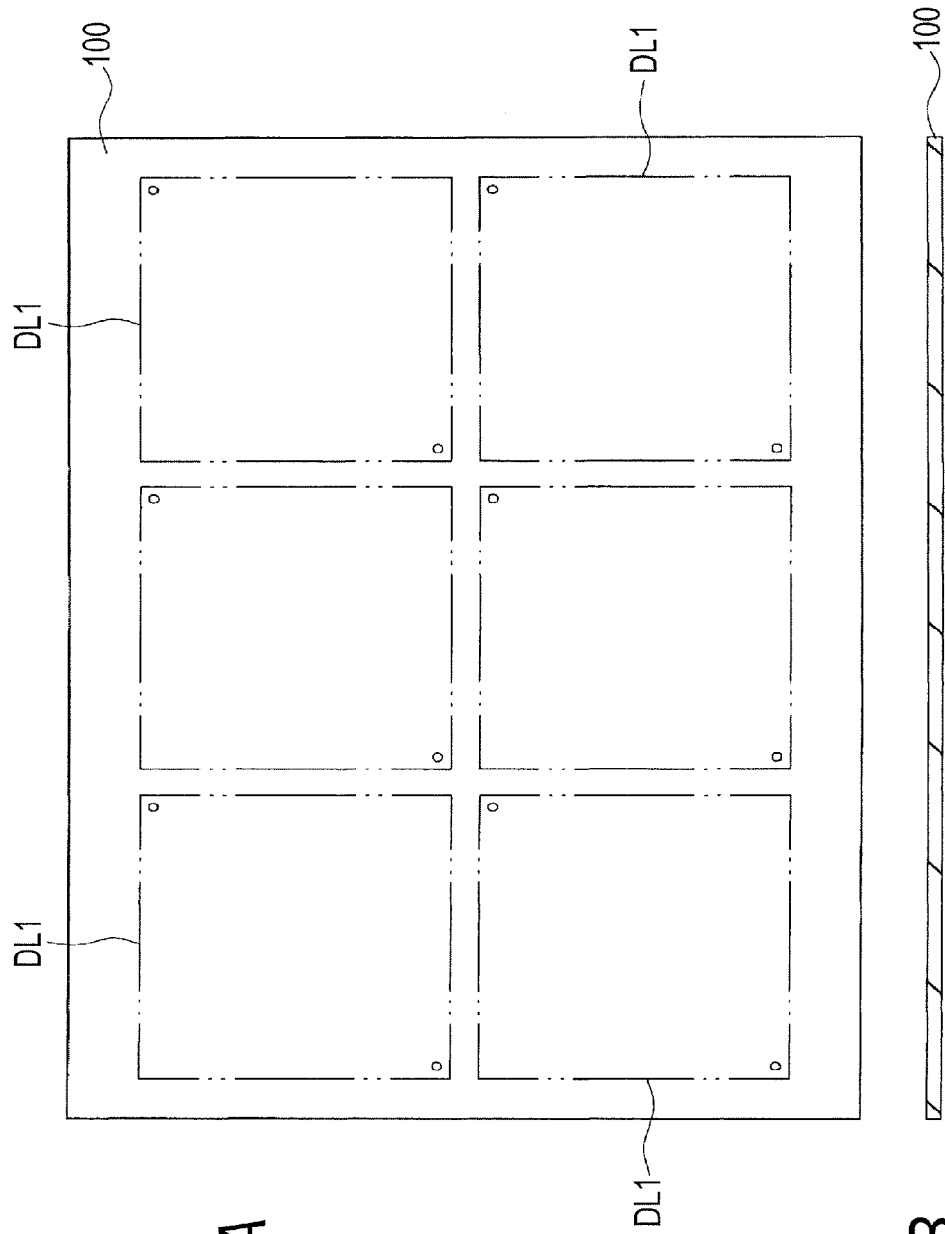
FIG. 9A is a plan view showing a chip-mounting surface of a large substrate used for manufacturing a semiconductor device according to Embodiment 1 and FIG. 9B is a sectional view of the large substrate.

Firstly, a large substrate 100 shown in FIG. 9 is provided. The large substrate 100 is a flat substrate the planar shape of which is a rectangle and is partitioned into a plurality of device regions (here 6 device regions) by dicing lines DL1 shown with two-dot chain lines in FIG. 9A. Each of the device regions is a region which comes to be a sub-substrate 50 of a semiconductor device 10 when the large substrate 100 is cut along the outer edges (dicing lines DL1) of the device regions; and has the same external dimensions as the sub-substrate 50.

Figure 10:
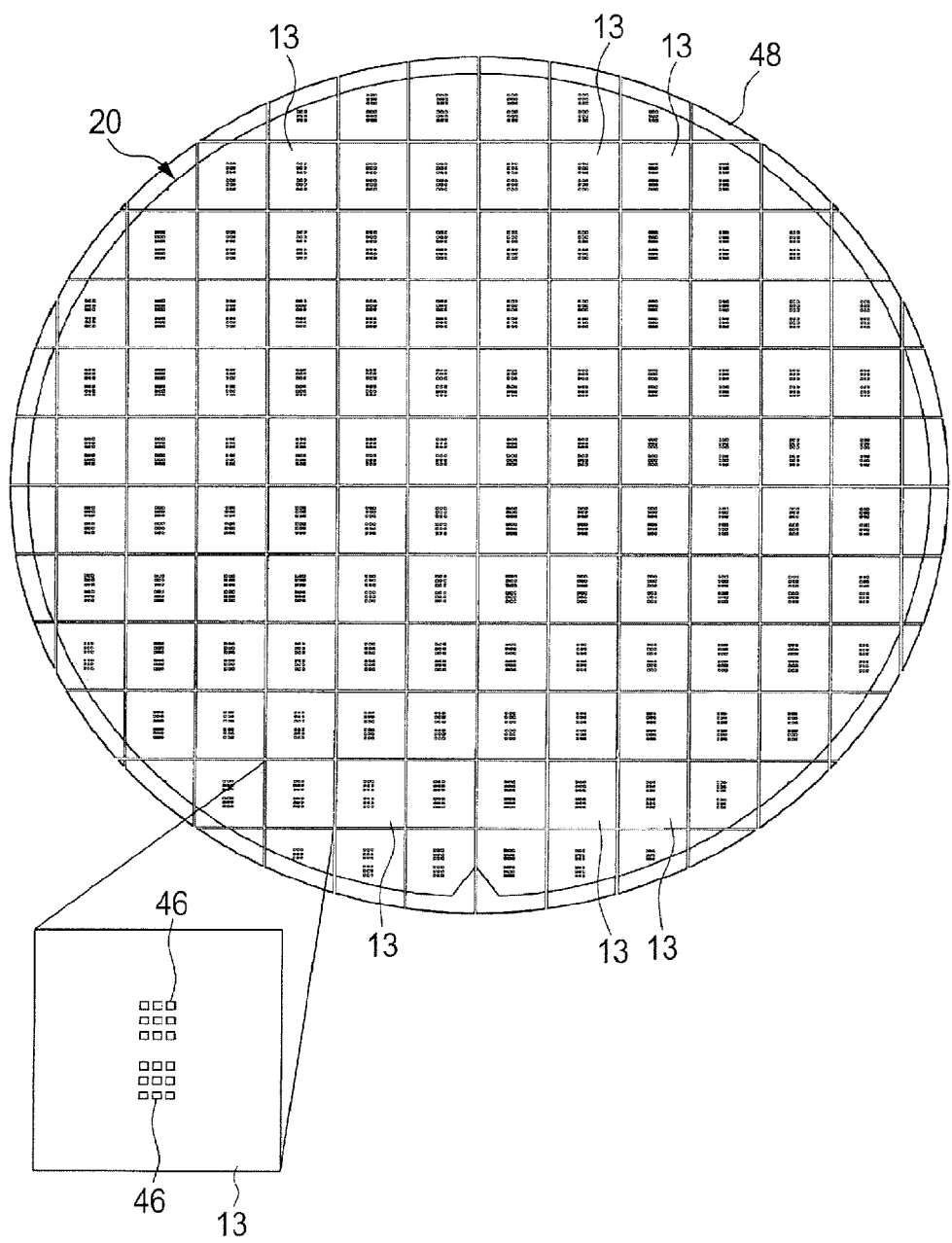
FIG. 10 is a plan view of a semiconductor wafer used for manufacturing a semiconductor device according to Embodiment 1.

Further a plurality of memory chips (first semiconductor chips) 13 are provided by dicing (cutting) a semiconductor wafer 20 shown in FIG. 10 in parallel with the step of providing the large substrate 100. As shown in FIGS. 7 and 8, a plurality of circuit elements (first semiconductor elements) configuring DRAM circuits and a plurality of main surface pads (first main surface pads) 45 are formed over a main surface (first main surface) of each of the memory chips 13. Furthermore, a bump electrode (first conductive member) 46 is formed over the surface of each of the main surface pads 45.

Here, the shape of the bump electrodes 46 formed over the surfaces of the main surface pads 45 is not limited to a ball (spherical) shape but may be a pillar shape like the bump electrodes 36 formed over the surfaces of the main surface pads 35 of the microcomputer chip 12 for example.

When the semiconductor wafer 20 is diced, an adhesive agent 48 (die attach film, first adhesive agent) is attached to the back surface thereof and the semiconductor wafer 20 and the adhesive agent 48 are cut simultaneously. By so doing, the adhesive agent 48 having the same external dimensions as a memory chip 13 remains over the back surface of each of the singulated memory chips 13. As a result, when the memory chips 13 are mounted over the large substrate 100, a step of supplying an adhesive agent to the device regions of the large substrate 100 comes to be unnecessary.

2. Die Bonding Step

Figure 11:
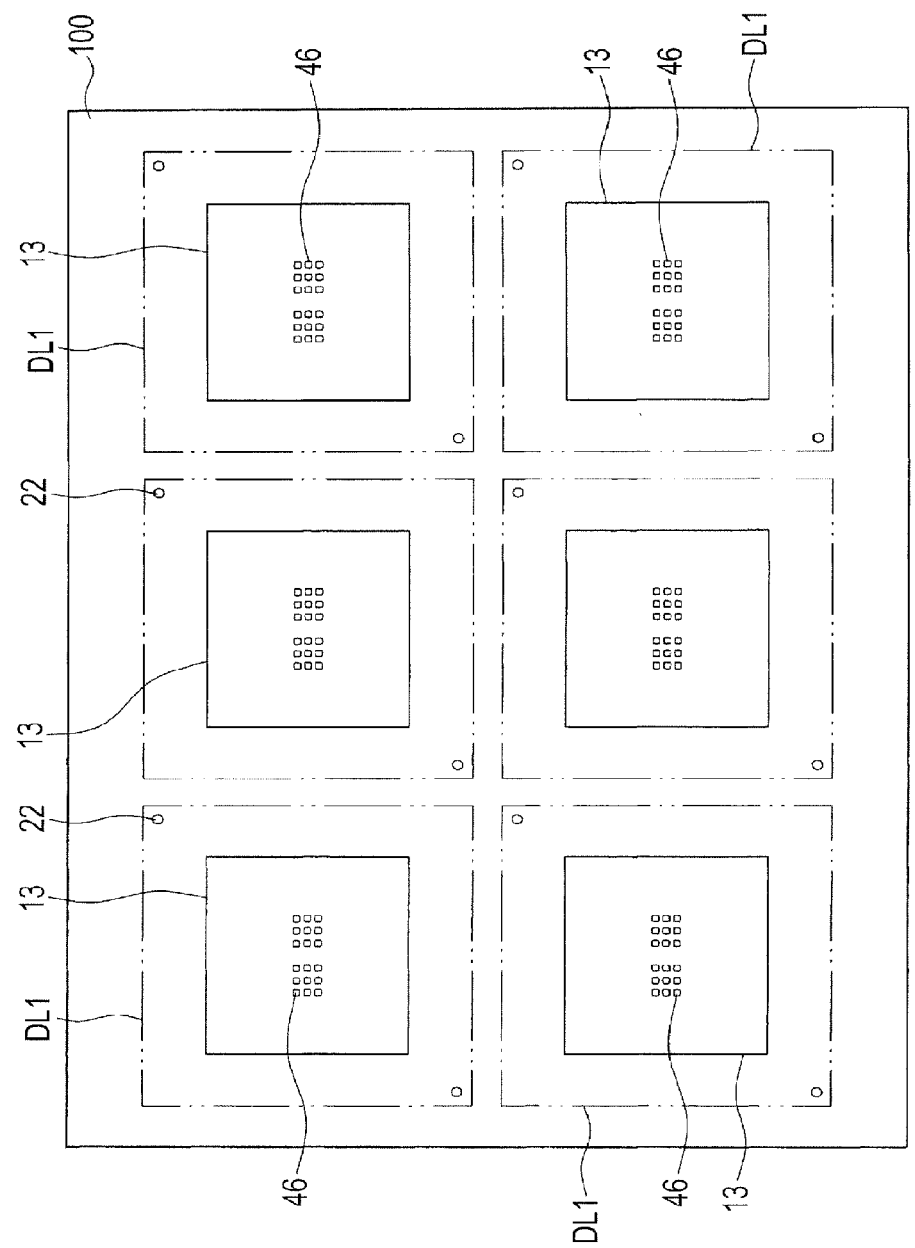
FIG. 11 is a plan view showing a method of manufacturing a semiconductor device according to Embodiment 1.
Figure 12:
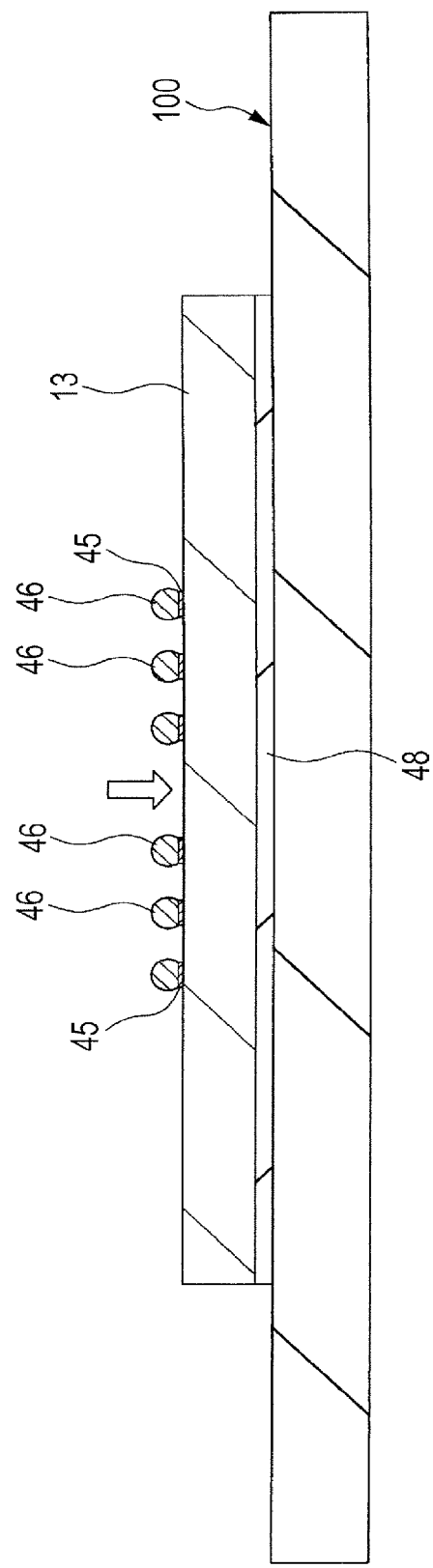
FIG. 12 is a partially-expanded sectional view showing method of manufacturing a semiconductor device according to Embodiment 1.

Successively as shown in FIG. 11 (a plan view of the large substrate 100 and FIG. 12 (a sectional view showing one device region of the large substrate 100), a memory chip 13 is mounted over each of the device regions of the large substrate 100. The memory chip 13 is mounted by a so-called face-up mounting method of opposing the back surface (the surface to which the adhesive agent 48 is attached, first back surface) to the memory chip 13 to a chip-mounting surface (first surface) of the large substrate 100. That is, after the back surface of the memory chip 13 is attached to the chip-mounting surface of the large substrate 100 through the adhesive agent 48, the large substrate 100 is heated, the adhesive agent 48 is cured, and thereby the memory chip 13 is fixed to the chip-mounting surface of the large substrate 100. The position adjustment of the device regions of the large substrate 100 and the memory chips 13 is carried out by using reference marks 22 formed in the device regions of the large substrate 100 for example.

Here, the die bonding of the memory chips 13 is not limited to a method of using the die attach film (adhesive agent 48) but can be carried out also by a method of supplying a pasty adhesive agent to the device regions of the large substrate 100 for example. An advantage of the pasty adhesive agent is that it is less expensive than a die attach film.

Figure 13:
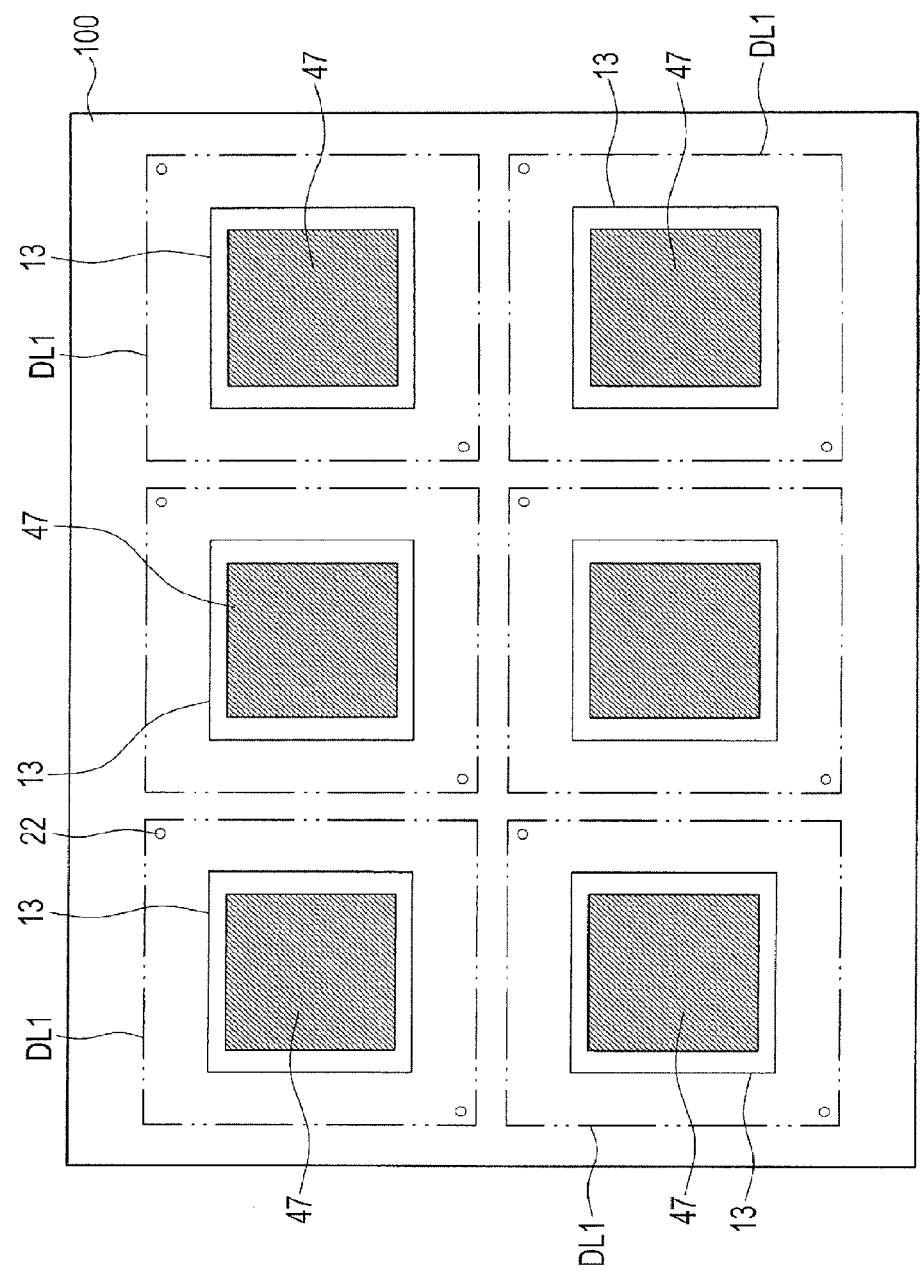
FIG. 13 is a plan view showing a method of manufacturing a semiconductor device succeeding to FIG. 11.
Figure 14:
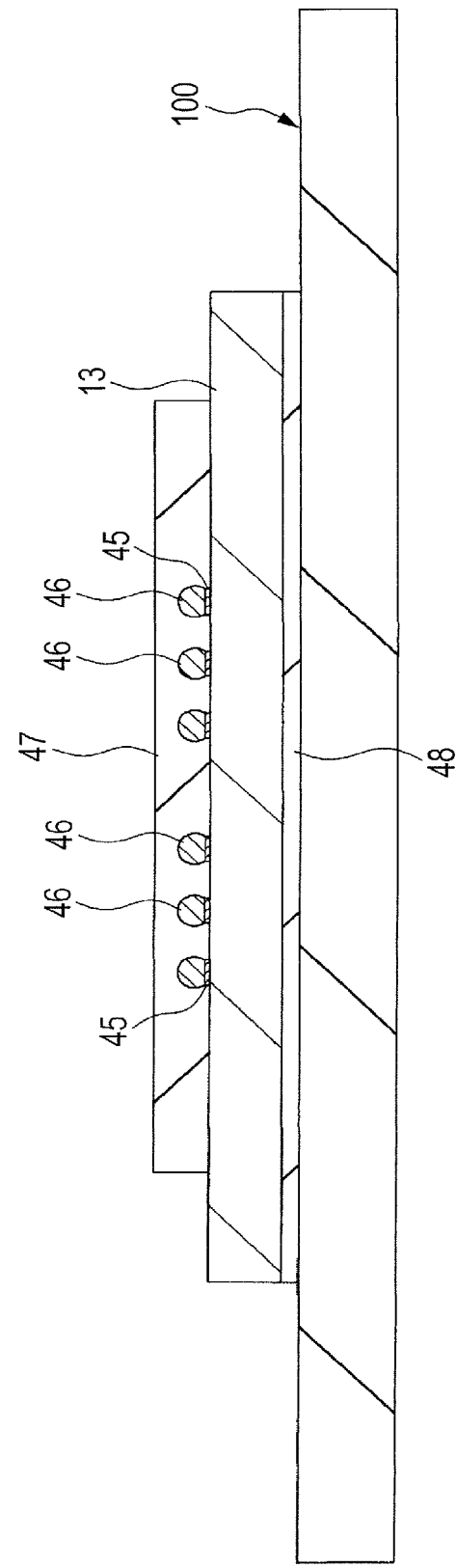
FIG. 14 is a partially-expanded sectional view showing a method of manufacturing a semiconductor device succeeding to FIG. 12.

Successively as shown in FIGS. 13 and 14, a filmy adhesive agent (second adhesive agent) 47 is mounted over the main surface of the memory chip 13. The adhesive agent 47 is the aforementioned NCF and the external dimensions thereof are smaller than the external dimensions of the memory chip 13 and larger than the external dimensions of a microcomputer chip 12 which is mounted over the main surface of the memory chip 13 at the next step. Here, the adhesive agent 47 can also include the NCP as stated earlier.

In the case of mounting such a filmy adhesive agent 47 as the NCF over the main surface of the memory chip 13, a vacuum lamination method is preferably adopted. By so doing, it is possible to prevent a gap from forming between the main surface of the memory chip 13 over which bump electrodes 46 are formed and the adhesive agent 47.

Figure 15:
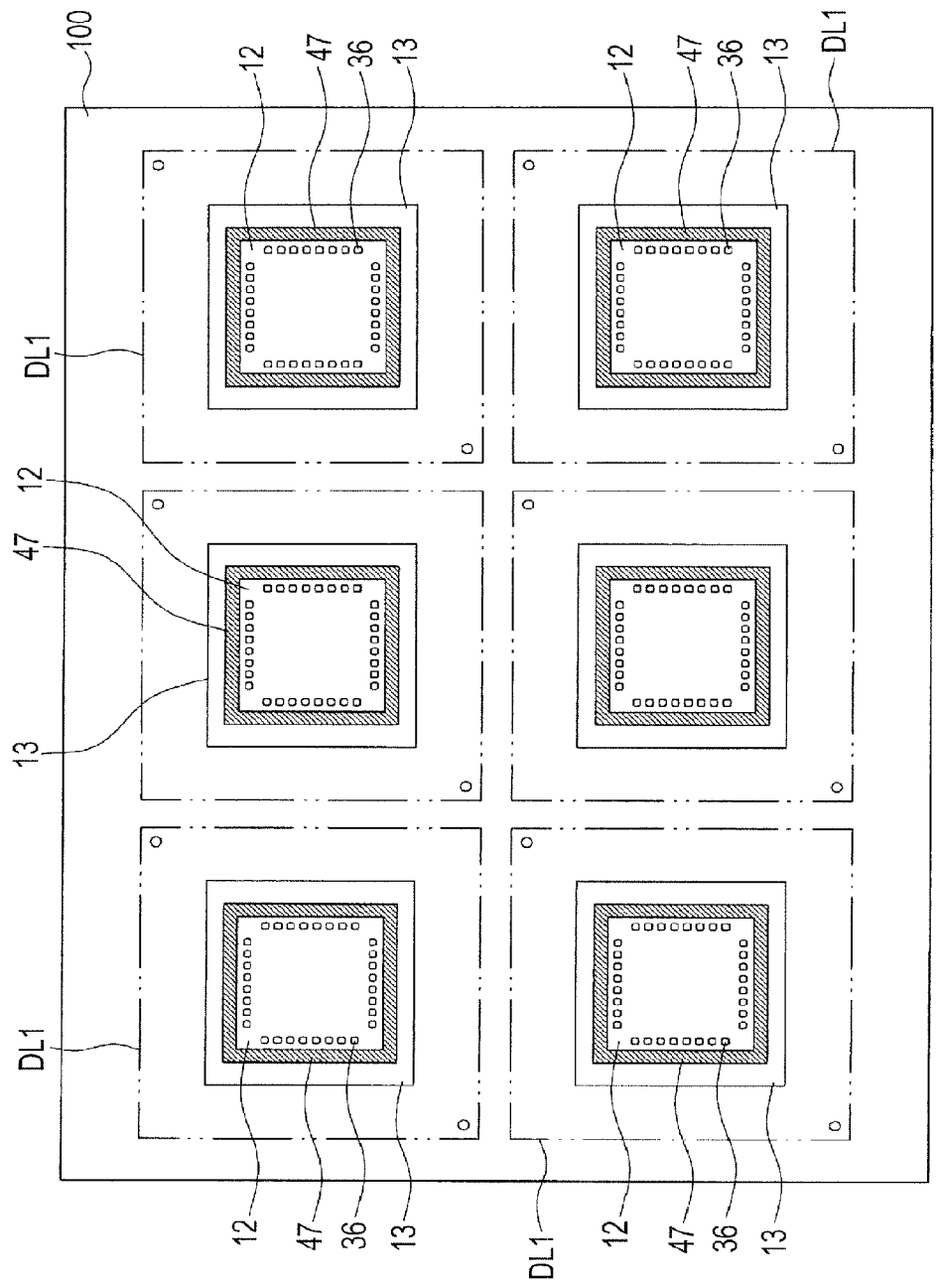
FIG. 15 is a plan view showing a method of manufacturing a semiconductor device succeeding to FIG. 13.
Figure 16:
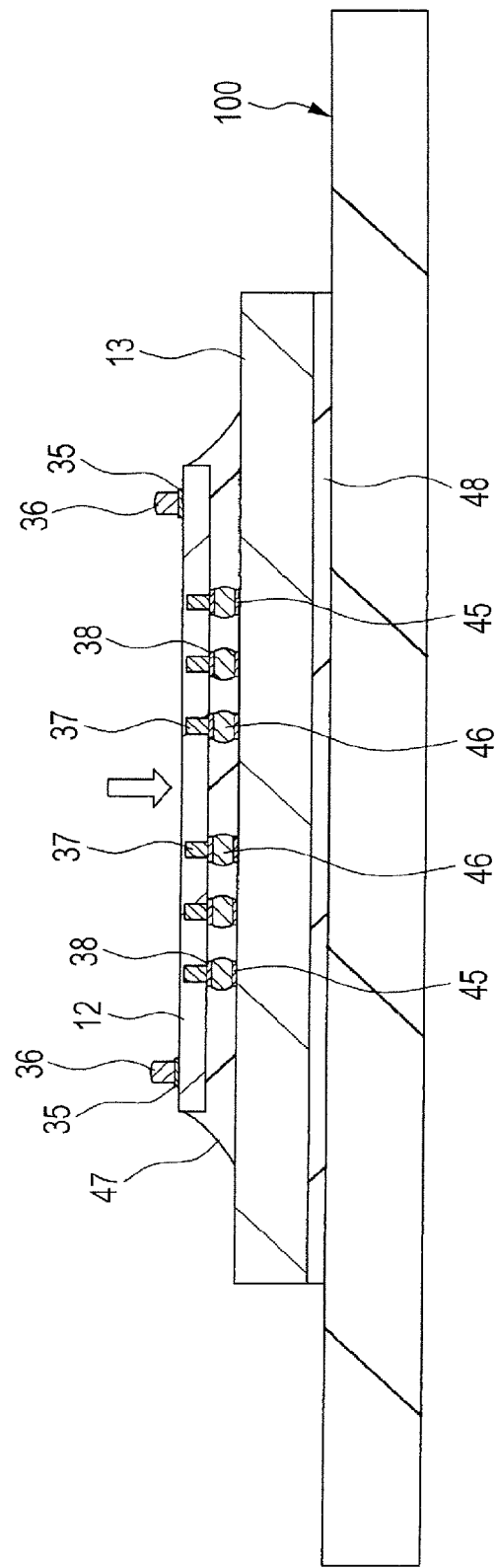
FIG. 16 is a partially-expanded sectional view showing a method of manufacturing a semiconductor device succeeding to FIG. 14.

Successively as shown in FIGS. 15 and 16, a microcomputer chip 12 is mounted over the main surface of the memory chip 13. As shown in FIGS. 4 and 6, a plurality of circuit elements (second semiconductor elements) configuring a logic circuit and a plurality of main surface pads (second main surface pads) 35 are formed over a main surface (second main surface) of the microcomputer chip 12. Further, a bump electrode (second conductive member) 36 is formed over the surface of each of the main surface pads 35. Furthermore, as shown in FIGS. 5 and 6, a plurality of back surface pads 38 electrically connected with a plurality of through-vias 37 formed in a silicon substrate 30 respectively are formed over a back surface (second back surface) of the microcomputer chip 12.

Here, the shape of the bump electrodes 36 formed over the surfaces of the main surface pads 35 is not limited to a pillar shape but may also be a ball (spherical) shape like the bump electrodes 46 formed over the surfaces of the main surface pads 45 of the memory chip 13 for example. In addition, the bump electrodes 36 of the microcomputer chip 12 and the bump electrodes 46 of the memory chip 13 can be comprised of protruding electrodes of gold (Au).

Figure 17:
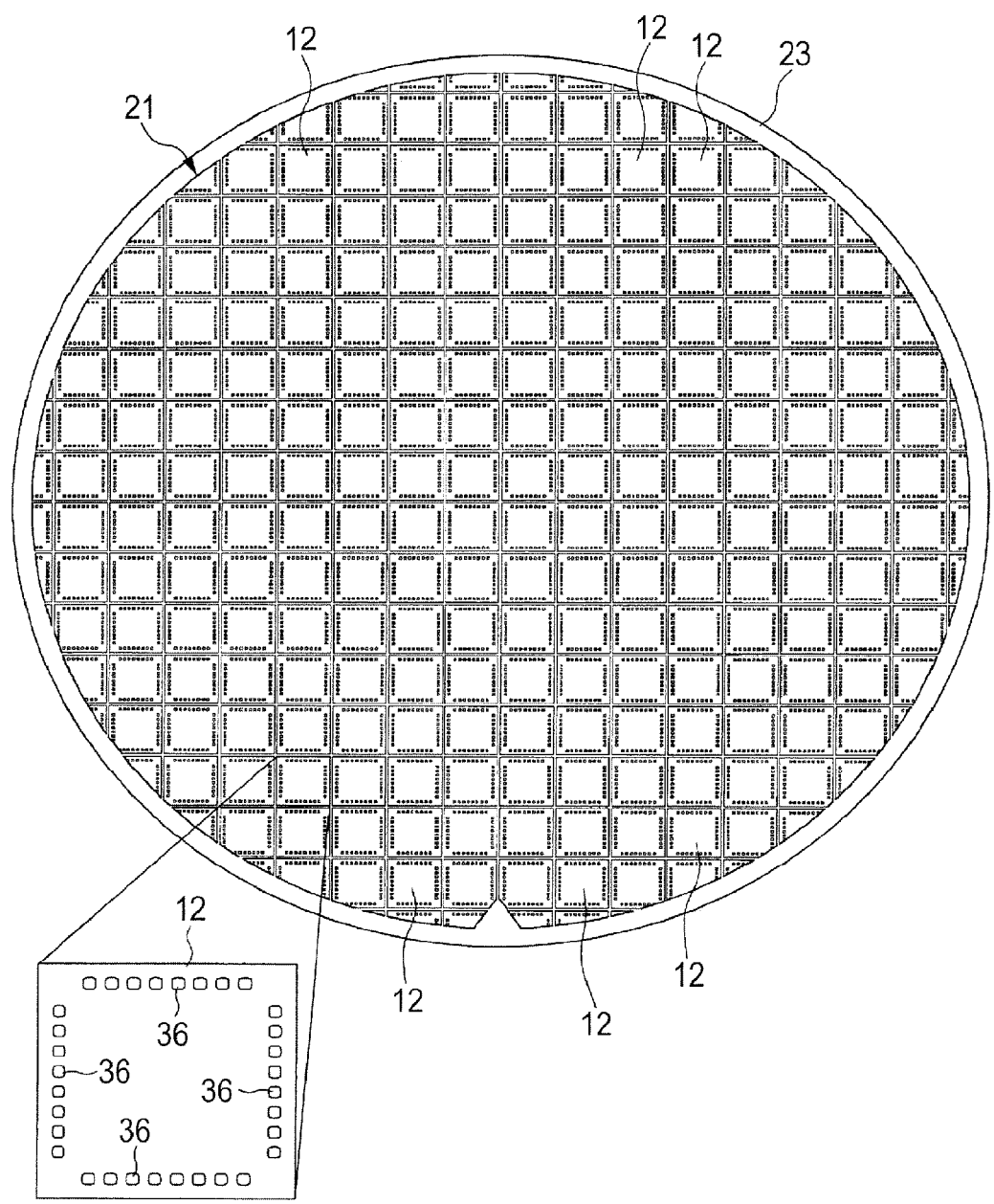
FIG. 17 is a plan view of a semiconductor wafer used for manufacturing a semiconductor device according to Embodiment 1.

The microcomputer chip 12 is provided in parallel with the step of providing the large substrate 100 in the same manner as the memory chip 13. That is, a plurality of microcomputer chips (second semiconductor chips) 12 are provided by dicing (cutting) a semiconductor wafer 21 shown in FIG. 17.

When the semiconductor wafer 21 is diced, a dicing film 23 is attached to a back surface thereof and only the semiconductor wafer 21 is cut. By so doing, the singulated microcomputer chips 12 are also in the state of being attached to the dicing film 23 and hence it is possible to collectively convey the microcomputer chips 12 to a bonding step.

When the microcomputer chip 12 is mounted over the main surface of the memory chip 13, after a microcomputer chip 12 attached to the dicing film 23 is picked up and arranged above the memory chip 13, the back surface thereof is opposed to the main surface of the memory chip 13. Successively, by impressing the microcomputer chip 12 onto the adhesive agent 47 over the main surface of the memory chip 13, the back surface pads 38 of the microcomputer chip 12 are electrically connected with the bump electrodes 46 of the memory chip 13. Then by heating and curing the adhesive agent 47 in the state, the microcomputer chip 12 is fixed to the memory chip 13 and the joint of the both chips (the back surface pads 38 of the microcomputer chip 12 and the main surface pads 45 and the bump electrodes 46 of the memory chip 13) are sealed with the adhesive agent 47.

3. Sealing and Substrate Sticking Step

Figure 18:
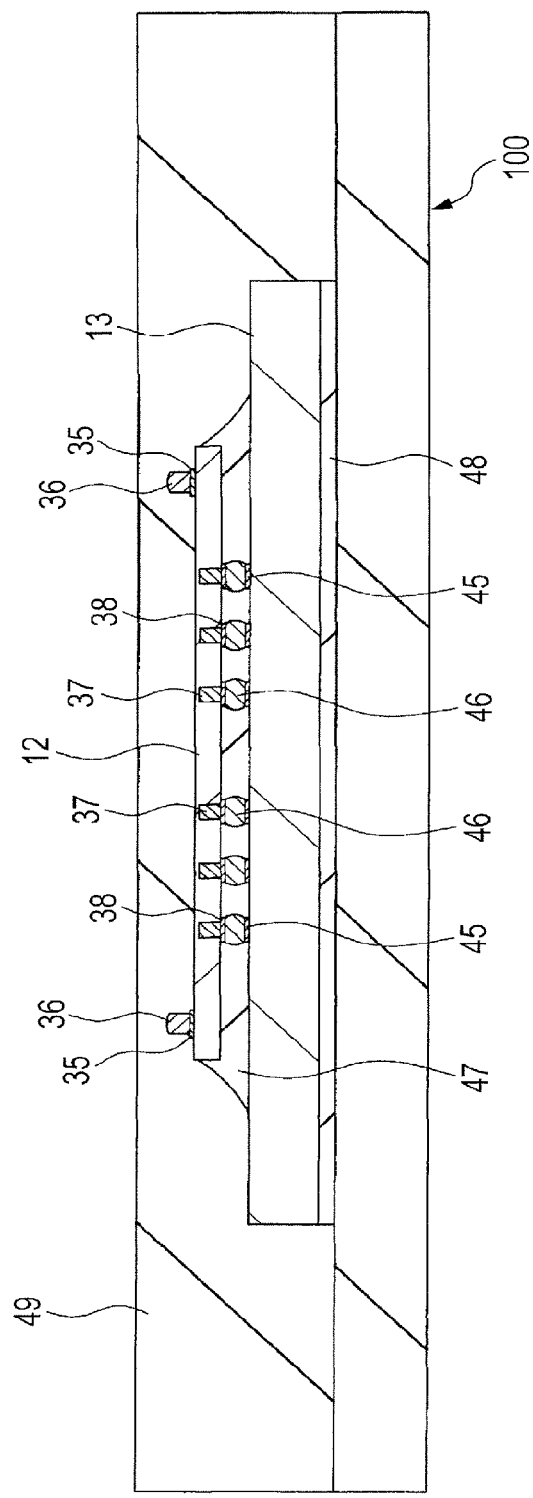
FIG. 18 is a partially-expanded sectional view showing a method of manufacturing a semiconductor device succeeding to FIG. 16.

Successively as shown in FIG. 18, a filmy sealing material 49 is mounted over the chip-mounting surface of the large substrate 100. The sealing material 49 is the aforementioned NCF. The sealing material 49 is a member to seal the memory chip 13 and the microcomputer chip 12 and has a heavy film thickness such that the bump electrodes 36 formed over the main surface of the microcomputer chip 12 may not be exposed. Further, the sealing material 49 has the external dimensions identical to the external dimensions of the large substrate 100 and is mounted so as to cover the whole chip-mounting surface of the large substrate 100.

In the case of mounting such a filmy sealing material 49 as the NCF over the chip-mounting surface of the large substrate 100, a vacuum lamination method is preferably adopted. By so doing, it is possible to prevent a gap from forming between the memory chip 13 and the adhesive agent 47 or between the microcomputer chip 12 and the adhesive agent 47.

Figure 19:
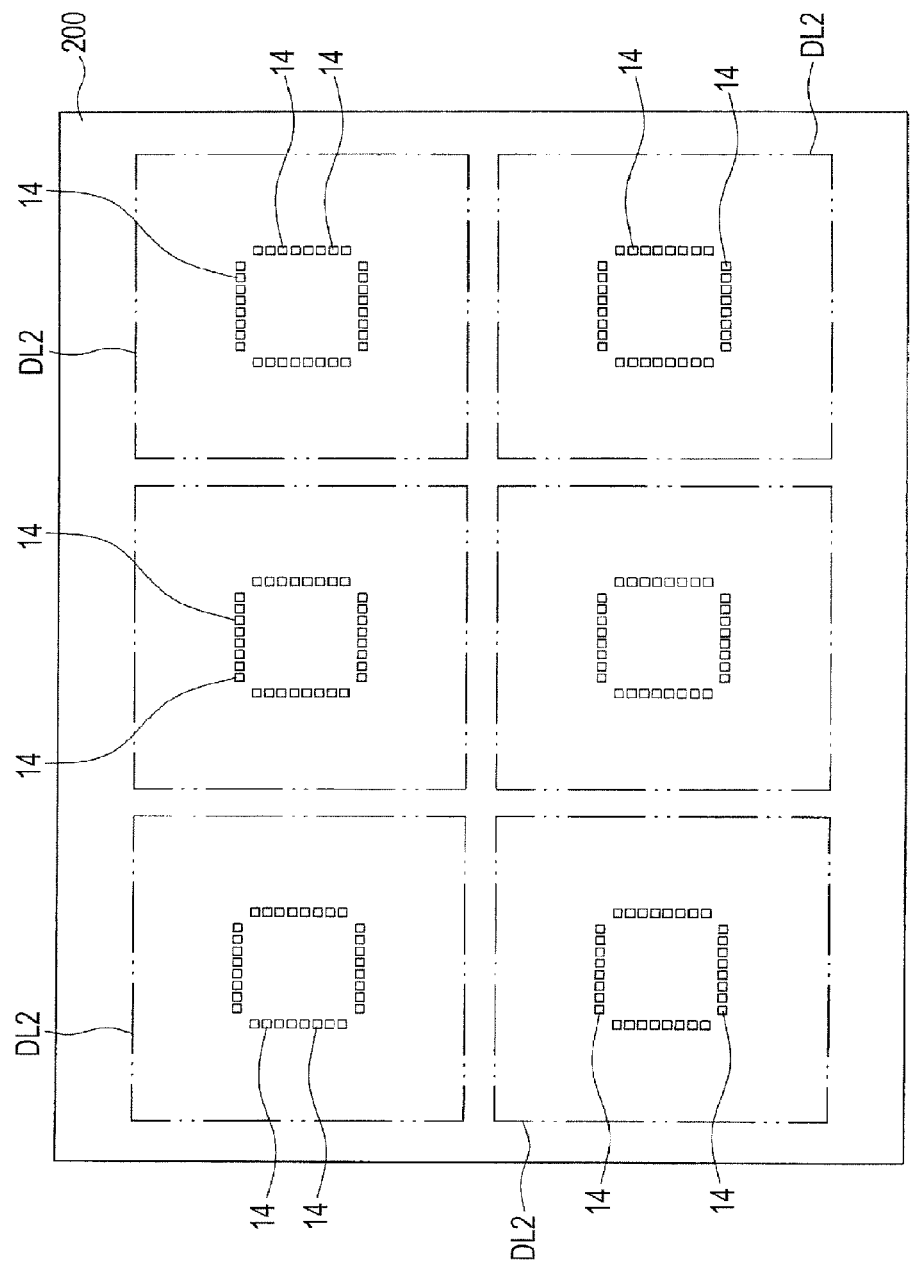
FIG. 19 is a plan view showing a chip-mounting surface of a large wiring substrate used for manufacturing a semiconductor device according to Embodiment 1.
Figure 20:
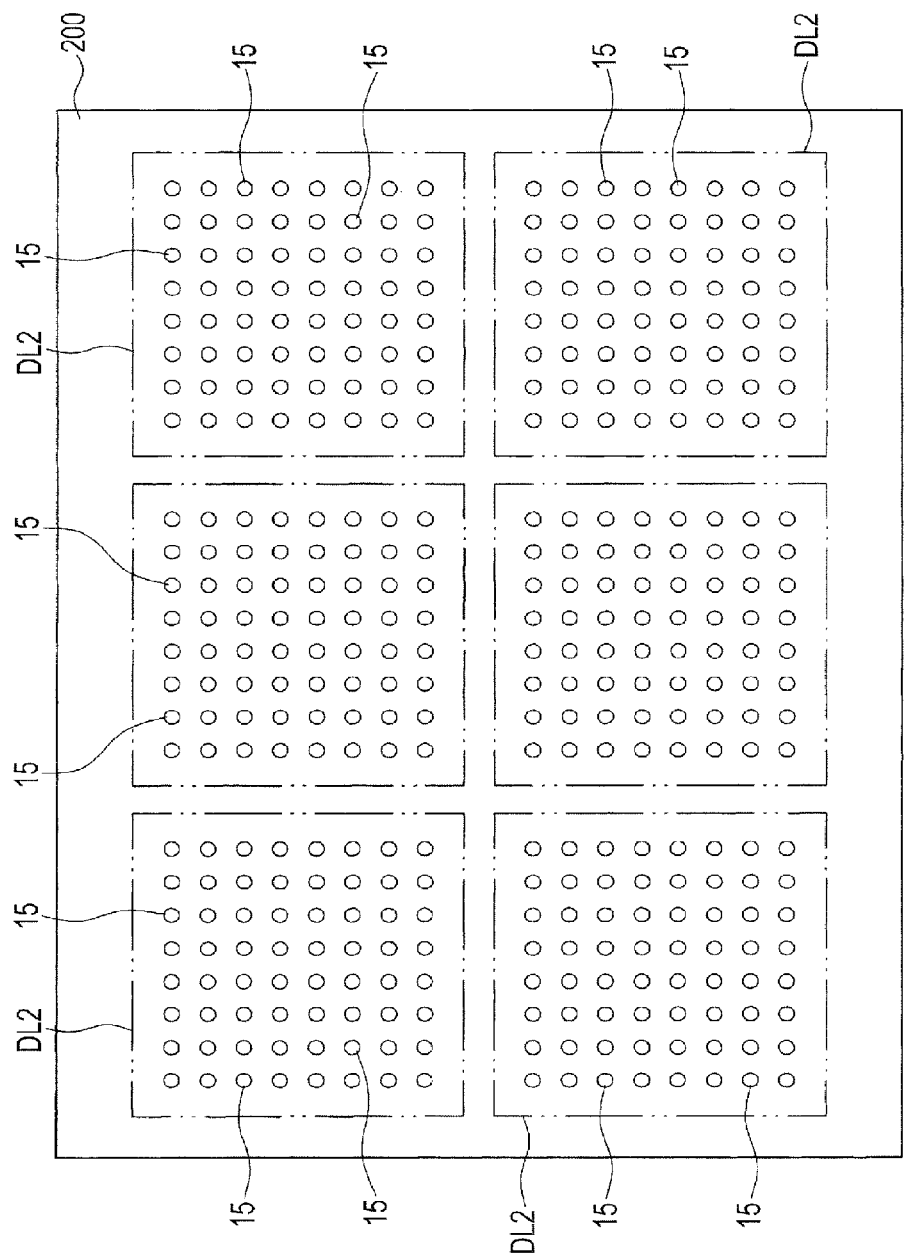
FIG. 20 is a plan view showing a mounting surface of a large wiring substrate used for manufacturing a semiconductor device according to Embodiment 1.

Successively, a large wiring substrate 200 shown in FIGS. 19 and 20 is provided FIG. 19 is a plan view showing a chip-mounting surface of the large wiring substrate 200. FIG. 20 is a plan view showing a mounting surface of the large wiring substrate.

The large wiring substrate 200 is a wiring substrate the planar shape of which is a rectangle and has the same external dimensions as the large substrate 100. Further, the large wiring substrate 200 is partitioned into a plurality of here six device regions by dicing lines DL2 shown with the two-dot chain lines in FIGS. 19 and 20. Each of the plural device regions: is a region which comes to be a base substrate 11 of the aforementioned semiconductor device 10 when the large wiring substrate 200 is cut along the outer edges (dicing lines DL2) of the device regions; and has the same structure and external dimensions as the base substrate 11. A plurality, of bonding leads 14 are formed in each of the device regions over the chip-mounting surface (third surface) of the large wiring substrate 200 and a plurality of bump lands 15 are formed in each of the device regions over the mounting surface fourth surface).

Figure 21:
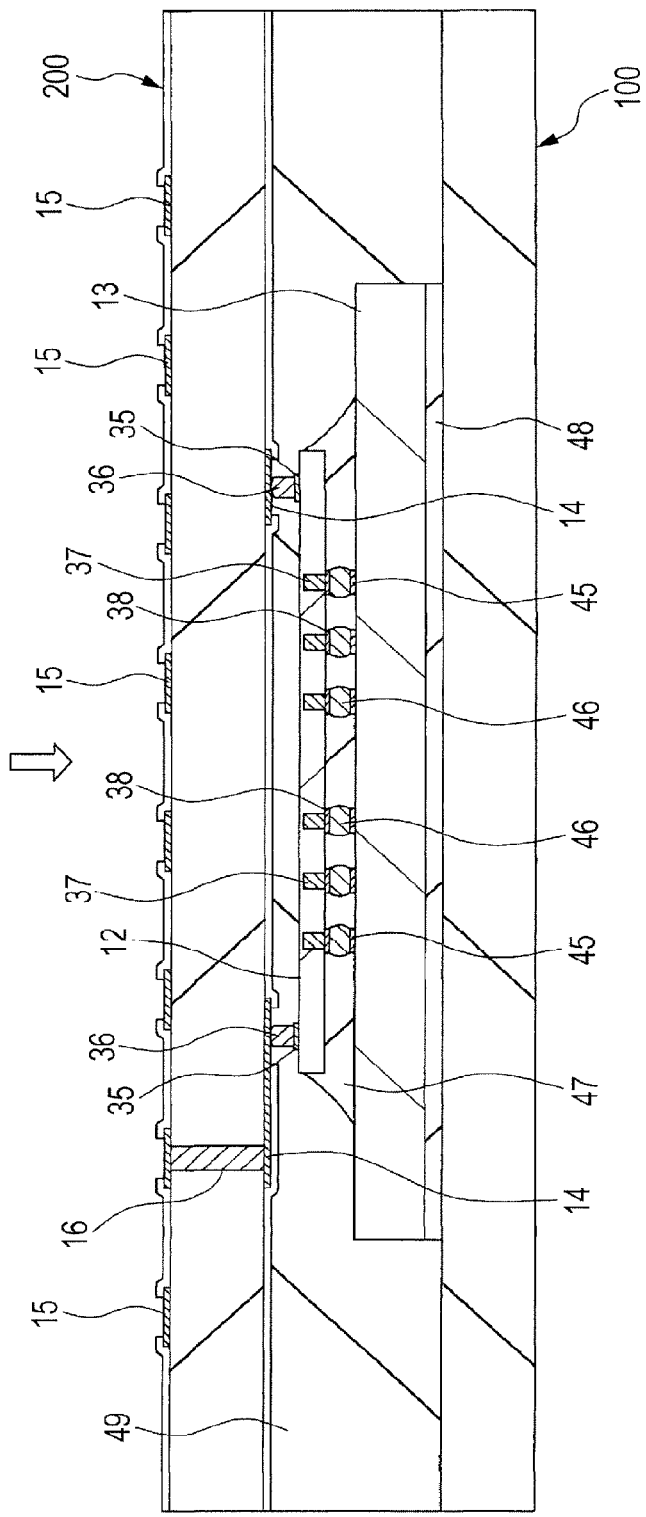
FIG. 21 is a partially-expanded sectional view showing a method of manufacturing a semiconductor device succeeding to FIG. 18.

Successively as shown in FIG. 21 (a sectional vie showing one device region of the large wiring substrate 200 by opposing the chip-mounting surface of the large wiring substrate 200 to the large substrate 100 and impressing the large wiring substrate 200 downward (in the direction of the chip-mounting surface of the large substrate 100), the bonding leads 14 of the large wiring substrate 200 are electrically connected with the bump electrodes 36 of the microcomputer chip 12. Then the sealing material 49 is heated and cured in the state. By so doing, the chip laminate comprised of the microcomputer chip 12 and the memory chip 13 is fixed between the large wiring substrate 200 and the large substrate 100 and airtightly sealed with the sealing material 49.

Figure 22:
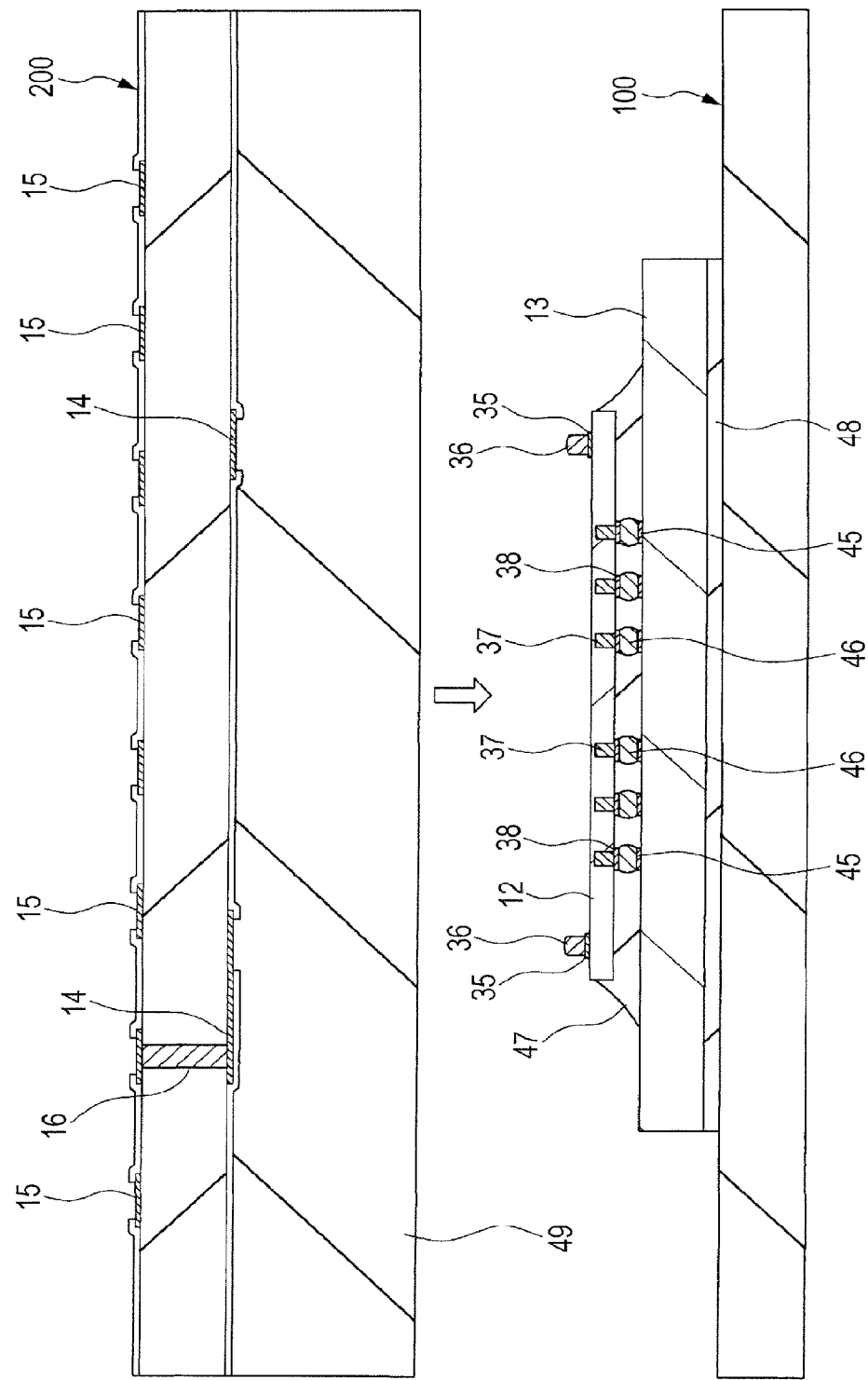
FIG. 22 is a partially-expanded sectional view showing another example of a method of manufacturing a semiconductor device succeeding to FIG. 16.

Here, although the large wiring substrate 200 and the large substrate 100 are laminated after the sealing material 49 is mounted over the chip-mounting surface of the large substrate 100 in the above manufacturing method, it is also possible to laminate the large wiring substrate 200 and the large substrate 100 after the sealing material 49 is attached over the chip-mounting surface of the large wiring substrate 200 beforehand as shown in FIG. 22.

Further, although the large wiring substrate 200 and the large substrate 100 having identical external dimensions are laminated (FIG. 21) in the above manufacturing method, the external dimensions of the large wiring substrate 200 may be smaller than the external dimensions of the large substrate 100.

Figure 23:
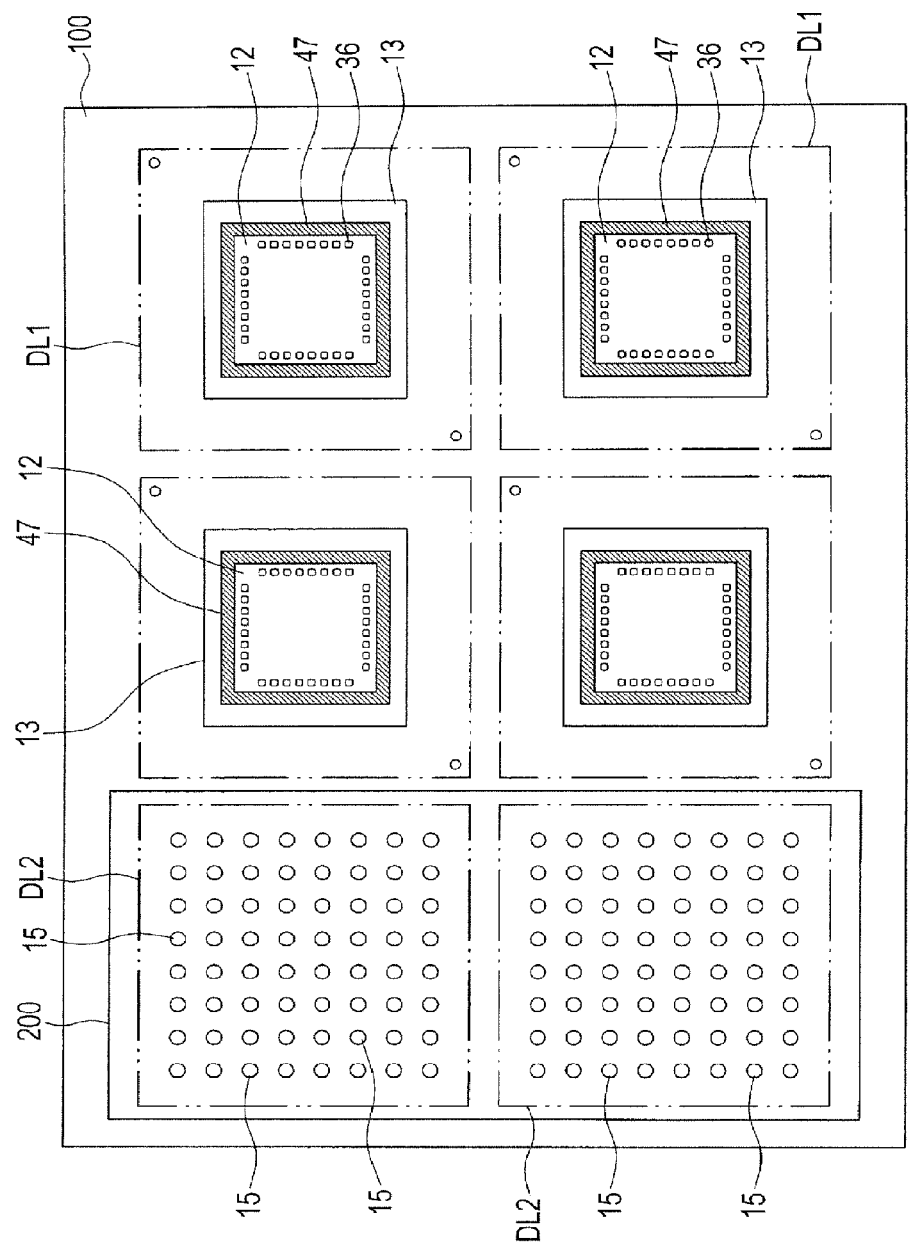
FIG. 23 is a plan view showing another example of a method of manufacturing a semiconductor device succeeding to FIG. 18.
Figure 24:
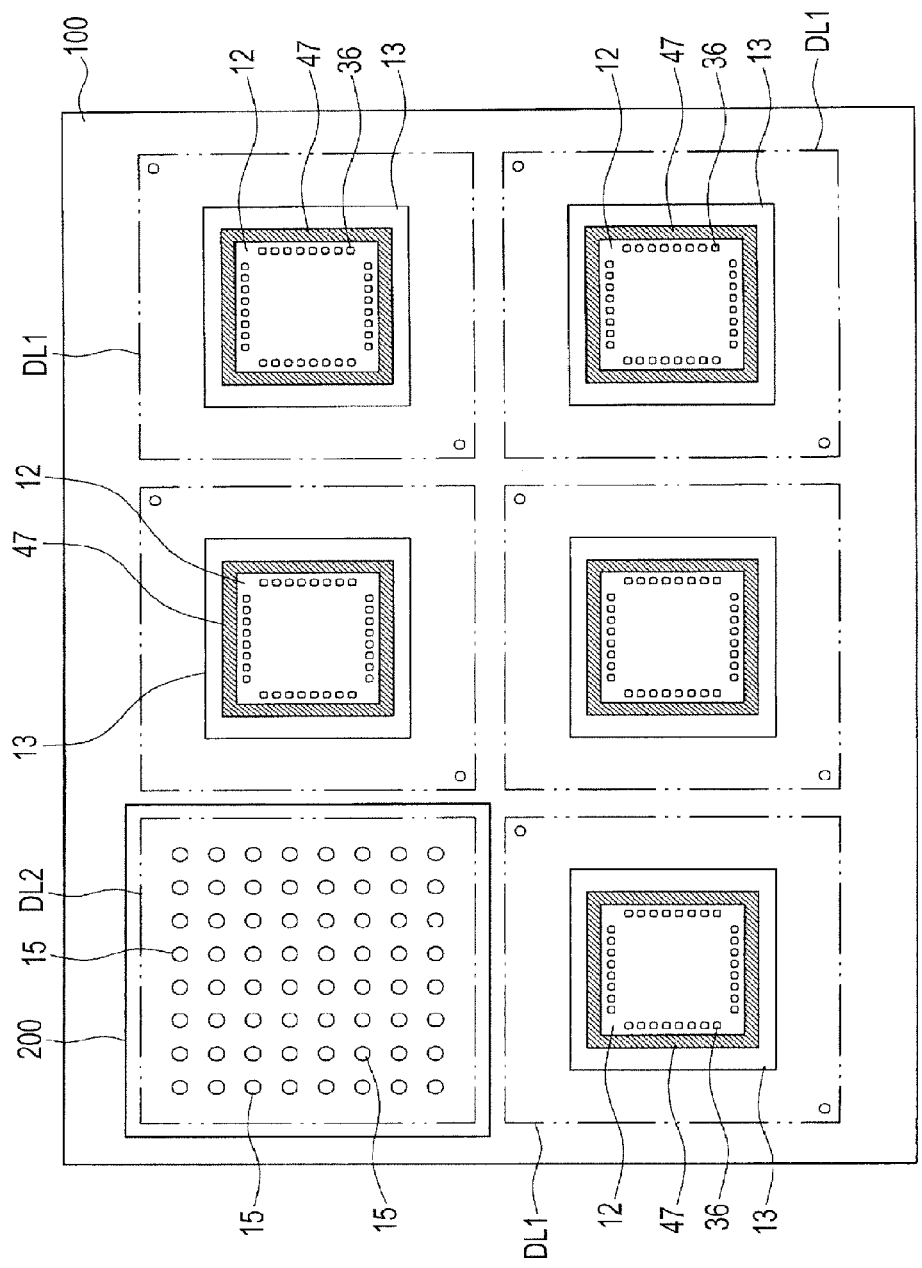
FIG. 24 is a plan view showing another example of a method of manufacturing a semiconductor device succeeding to FIG. 18.

That is, it is also possible to divide the large wiring substrate 200 having the same external dimensions as the large substrate 100 into a plurality of blocks beforehand and laminate each of the blocks of the divided large wiring substrate 200 to the large substrate 100 as shown in FIG. 23. Further, it is also possible to divide the large wiring substrate 200 into device regions beforehand and laminate the divided large wiring substrate 200 one by one to each of the device regions of the large substrate 100 as shown in FIG. 24. Those methods are effectively applicable in the case where a device region of the large substrate 100 is hardly adjustable precisely to a device region of the large wiring substrate 200 because of the warpage of the large substrate 100 or the large wiring substrate 200, or the like.

4. Ball Mounting Step

Figure 25:
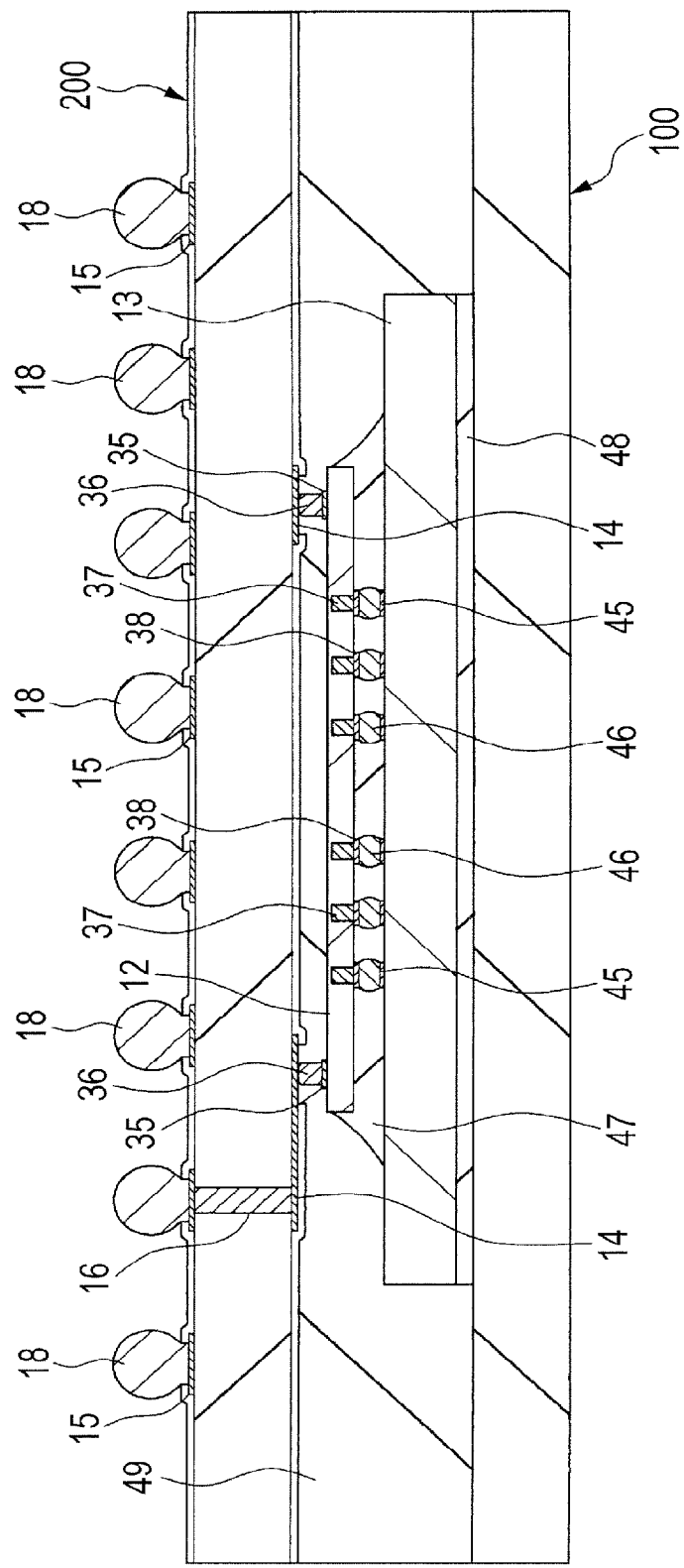
FIG. 25 is a partially-expanded sectional view showing a method of manufacturing a semiconductor device succeeding to FIG. 21.

Successively as shown in FIG. 25, a solder ball 18 is coupled to the surface of each of the bump lands 15 formed over the mounting surface of the large, wiring substrate 200. In order to couple a solder ball 18 to the surface of each of the bump lands 15, the solder ball 18 is temporarily fixed to the surface of each of the bump lands 15 coated with a flux beforehand and thereafter heated and reflowed.

5. Cutting Step

Successively, a semiconductor device 10 according to Embodiment 1 shown in FIGS. 1 to 3 is completed by cutting the large wiring substrate 200 and the large substrate 100 along the outer edges (dicing lines DL1 and DL2) of the respective device regions.

In this way, in Embodiment 1, when a SIP type semiconductor device 10 formed by mounting a chip laminate comprised of a microcomputer chip 12 and a memory chip 13 over a base substrate 11 is manufactured, firstly the memory chip 13 having large external dimensions is mounted over a large substrate 100 (sub-substrate 50). Successively, the microcomputer chip 12 having smaller external dimensions than the memory chip 13 is laminated over the memory chip 13 and the memory chip 13 is electrically connected with the microcomputer chip 12. Then finally, a large wiring substrate 200 (base substrate 11 is laminated over the microcomputer chip 12 and thereby the microcomputer chip 12 is electrically connected with the large wiring substrate 200 base substrate 11).

By the manufacturing method stated above, it is possible to suppress the inclination and unsteadiness of a microcomputer chip 12 of an upper layer by laminating the microcomputer chip 12 having small external dimensions over a memory chip 13 having large external dimensions. By so doing, an excessive stress is not added to a joint of the microcomputer chip 12 and the memory chip 13 and hence it is possible to: inhibit the deterioration of the reliability of the joint of the microcomputer chip 12 and the memory chip 13 and the occurrence of chip cracks; and improve the reliability and the manufacturing yield of a SIP type semiconductor device 10.

<Modified Example of Embodiment 1>

Figure 26:
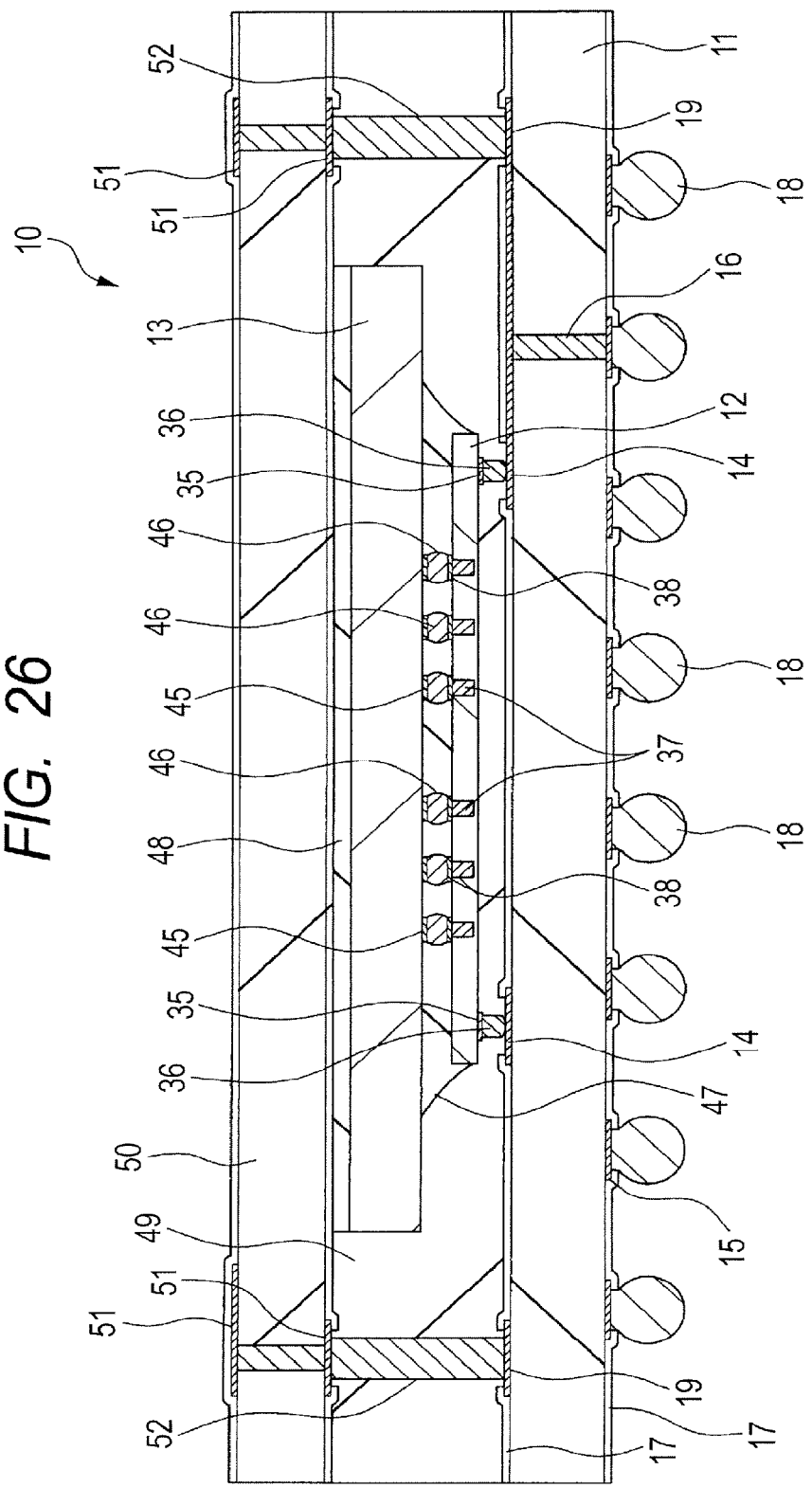
FIG. 26 is a sectional view showing a modified example of a semiconductor device according to Embodiment 1.

Although no wiring layer is formed over the sub-substrate 50 (large substrate 100) in Embodiment 1 stated above, it is also possible to form wirings 51 over both surfaces a chip-mounting surface and a back surface of an insulating member configuring a sub-substrate 50 (large substrate 100) as shown in FIG. 26 for example.

On this occasion, possible to mount electronic components also over the sub-substrate 50 by forming wirings 19 over a chip-mounting surface of a base substrate 11 beforehand and electrically connecting the wirings 51 of the sub-substrate 50 with the wirings 19 of the base substrate 11 through through-vias (conductive members) 52 formed in a sealing material 49 in advance of the sticking step as shown in the figure and hence it is possible to improve the mounting density of a semiconductor device 10.

On this occasion further, as the insulating member of the sub-substrate 50, a material other than a synthetic resin such as glass or ceramics may be used. By so doing, it is possible to reduce the thickness of the sub-substrate 50 in comparison with the case of using an insulating member comprised of a synthetic resin.

(Embodiment 2)

In a manufacturing method according to Embodiment 1, after memory chips 13 and microcomputer chips 12 are mounted over a chip-mounting surface of a large substrate 100, the large substrate 100 and a large wiring substrate 200 are laminated together. On the other hand, in a manufacturing method according to Embodiment 2, after memory chips 13 and microcomputer chips 12 are mounted over a chip-mounting surface of a large substrate 100, a base substrate (a large wiring substrate) is formed over main surfaces of the microcomputer chips 12.

Figure 27:
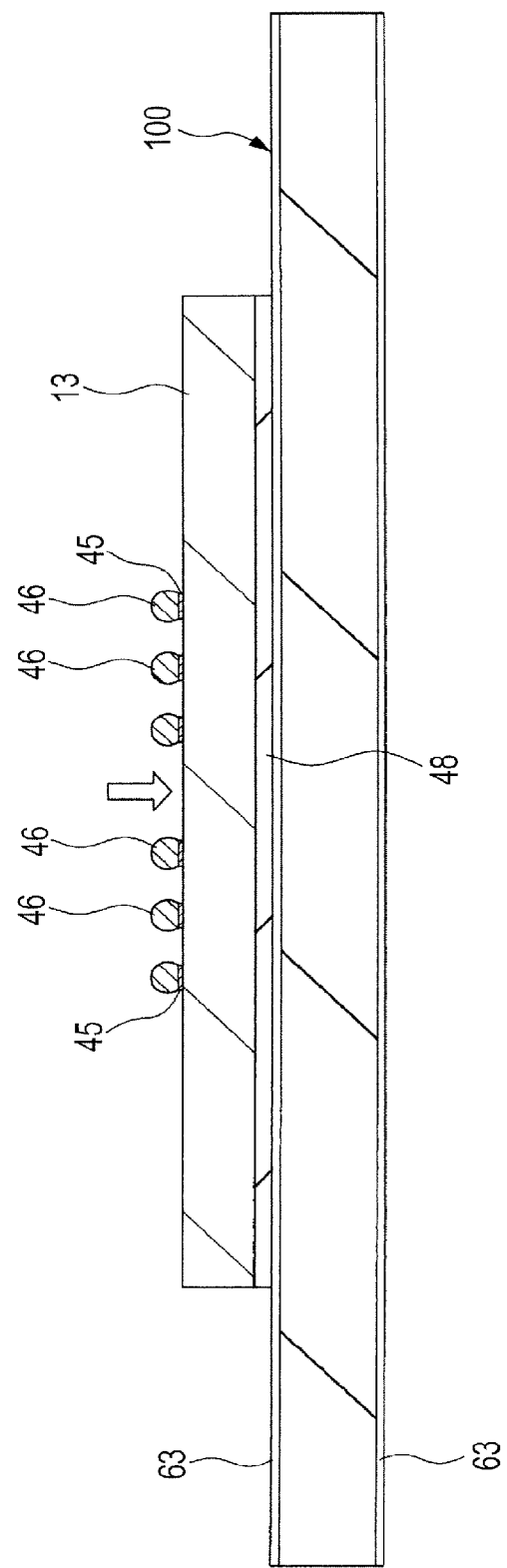
FIG. 27 is a partially-expanded sectional view showing a method of manufacturing a semiconductor device according to Embodiment 2.

Firstly as shown in FIG. 27 (a sectional view showing one device region of a large substrate 100), a memory chip 13 is mounted in each device region of the large substrate 100 through an adhesive agent 48 such as a die attach film in accordance with the manufacturing method of Embodiment 1. Here, black solder resists (insulating layers) 63 are formed over both surfaces (a chip-mounting surface and a back surface) of the large substrate 100 used in Embodiment 2 with the aim of protecting the memory chips 13 mounted over the large substrate 100 and shielding light (preventing soft error of a memory cell caused by light entering into a chip).

Figure 28:
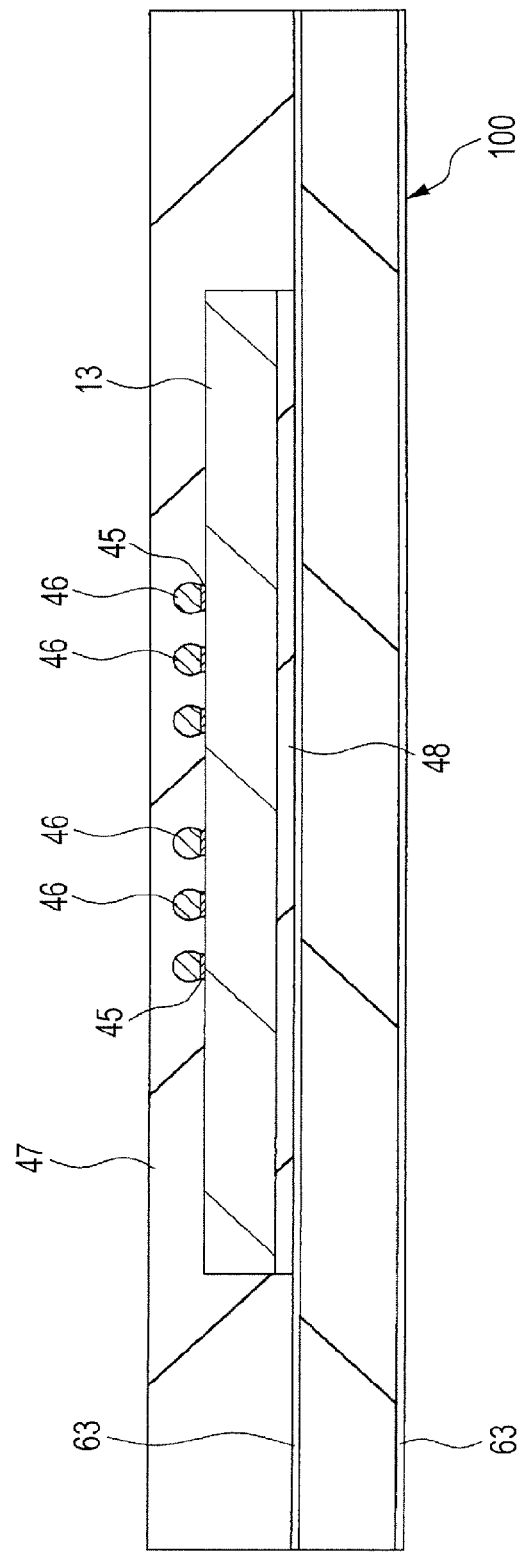
FIG. 28 is a partially-expanded sectional view showing a method of manufacturing a semiconductor device succeeding to FIG. 27.

Successively as shown in FIG. 28, a filmy adhesive agent 47 such as the aforementioned NCF is mounted over a main surface of the memory chip 13. Although an adhesive agent 47 having smaller external dimensions than a memory chip 13 is mounted over a main surface of the memory chip 13 in Embodiment 1 (FIGS. 13 and 14), an adhesive agent 47 having the same external dimensions as the large substrate 100 is used and attached to the whole chip-mounting surface of the large substrate 100 in Embodiment 2.

Figure 29:
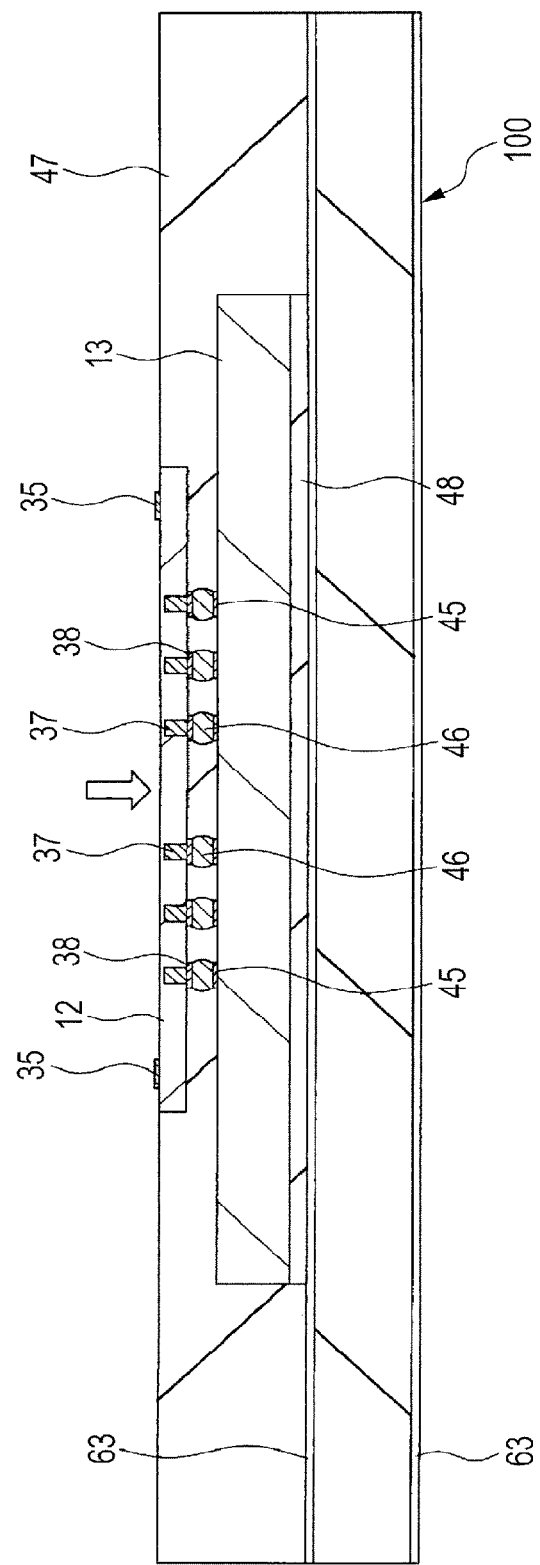
FIG. 29 is a partially-expanded sectional view showing a method of manufacturing a semiconductor device succeeding to FIG. 28.

Successively as shown in FIG. 29, after a microcomputer chip 12 is mounted over the main surface of the memory chip 13 and back surface pads 38 of the microcomputer chip 12 are electrically connected with bump electrodes 46 of the memory chip 13, the adhesive agent 47 is heated and cured. The microcomputer chip 12 is thereby fixed to the memory chip 13 and also the joint of the two chips (the back surface pads 38 of the microcomputer chip 12 and main surface pads 45 and the bump electrodes 46 of the memory chip 13) are sealed with the adhesive agent 47. Here, the adhesive agent 47 may also be a pasty adhesive material such as the NCP.

Although a microcomputer chip 12 having bump electrodes 36 formed over the surfaces of main surface pads 35 is used in Embodiment 1, a microcomputer chip 12 not having bump electrodes second conductive members) 36 formed over the surfaces of main surface pads 35 is used in Embodiment 2.

Figure 30:
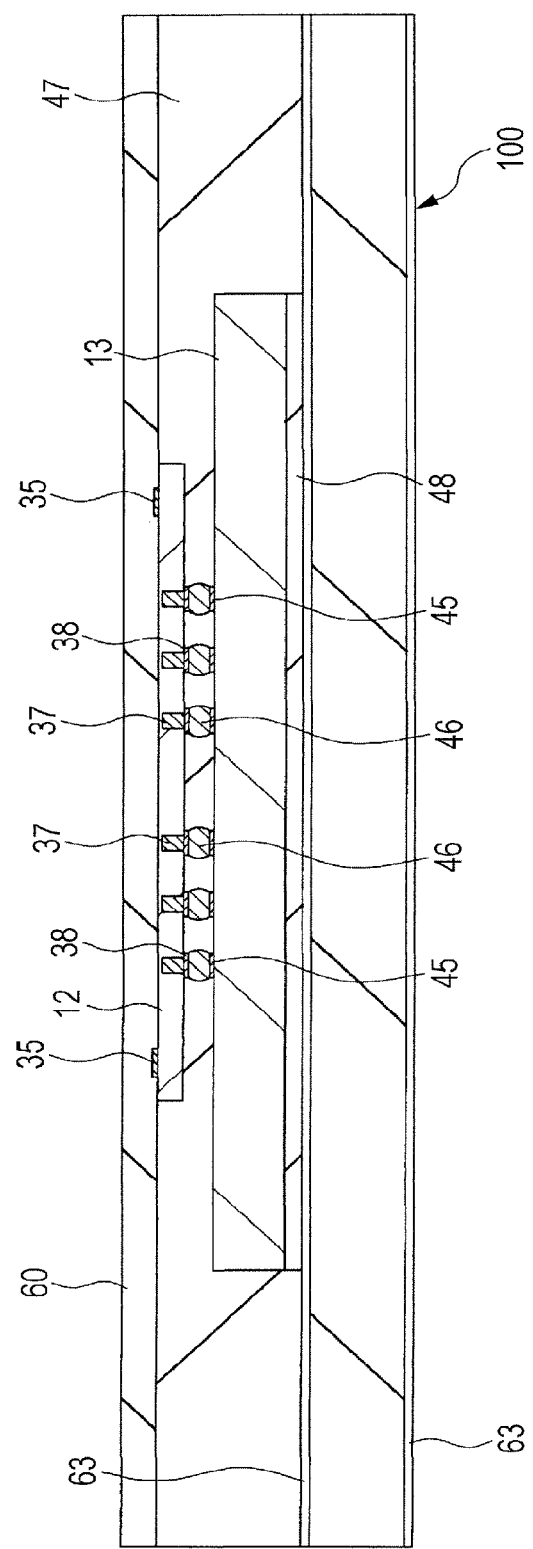
FIG. 30 is a partially-expanded sectional view showing a method of manufacturing a semiconductor device succeeding to FIG. 29.

Successively as shown in FIG. 30, an insulating film 60 is attached over the main surface of the microcomputer chip 12 and the surface of the adhesive agent 47 by using a vacuum lamination method for example. It is preferable that the insulating film 60 is comprised of an insulating member having a high chemical resistance to an electrolytic plating solution used in the succeeding wire forming step and a high adhesiveness to wiring materials. Examples of such an insulating member are a prepreg and an ABF (Ajinomoto Build-up Film: a trade name of a product produced by Ajinomoto Fine-Techno Co.), which are used for manufacturing multi-layered wiring substrates, in other words, used as insulating members for wiring substrates.

Figure 31:
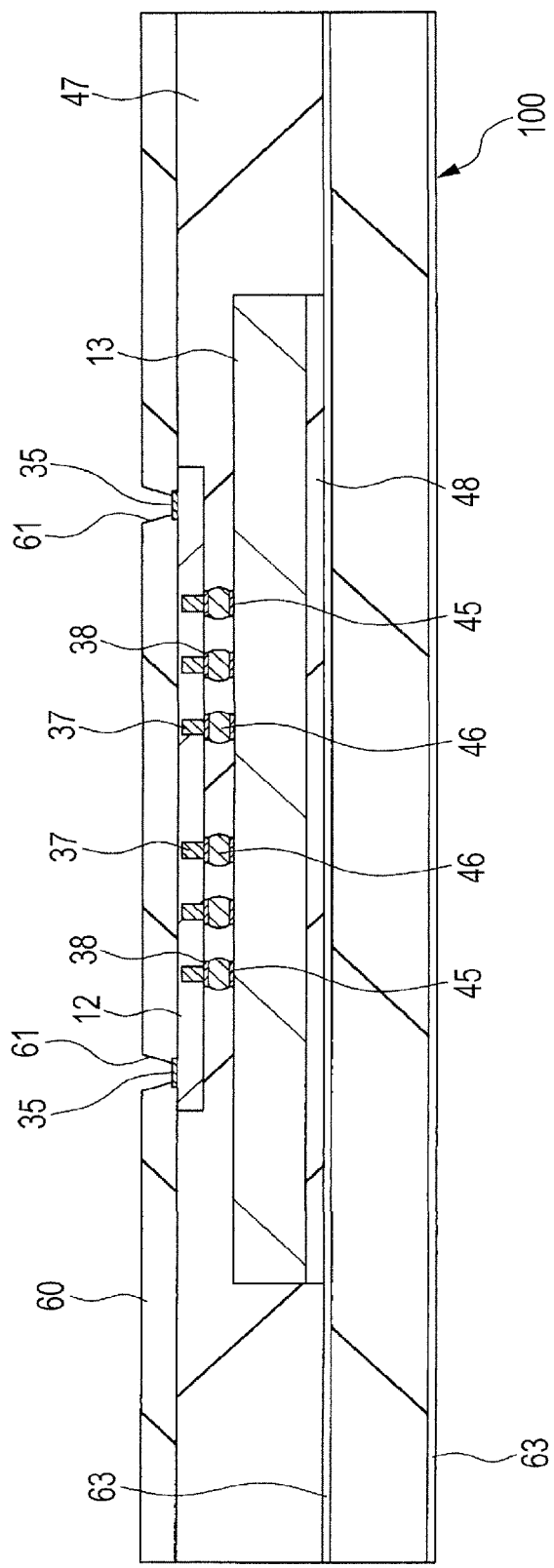
FIG. 31 is a partially-expanded sectional view showing a method of manufacturing a semiconductor device succeeding to FIG. 30.

Successively as shown in FIG. 31, a plurality of openings 61 are formed in the insulating film 60 above the main surface pads 35 formed over the main surface of the microcomputer chip 12 and the main surface pads 35 are exposed at the bottoms of the openings 61. The openings 61 are formed by irradiating the insulating film 60 above the main surface pads 35 with a laser beam for example.

Figure 32:
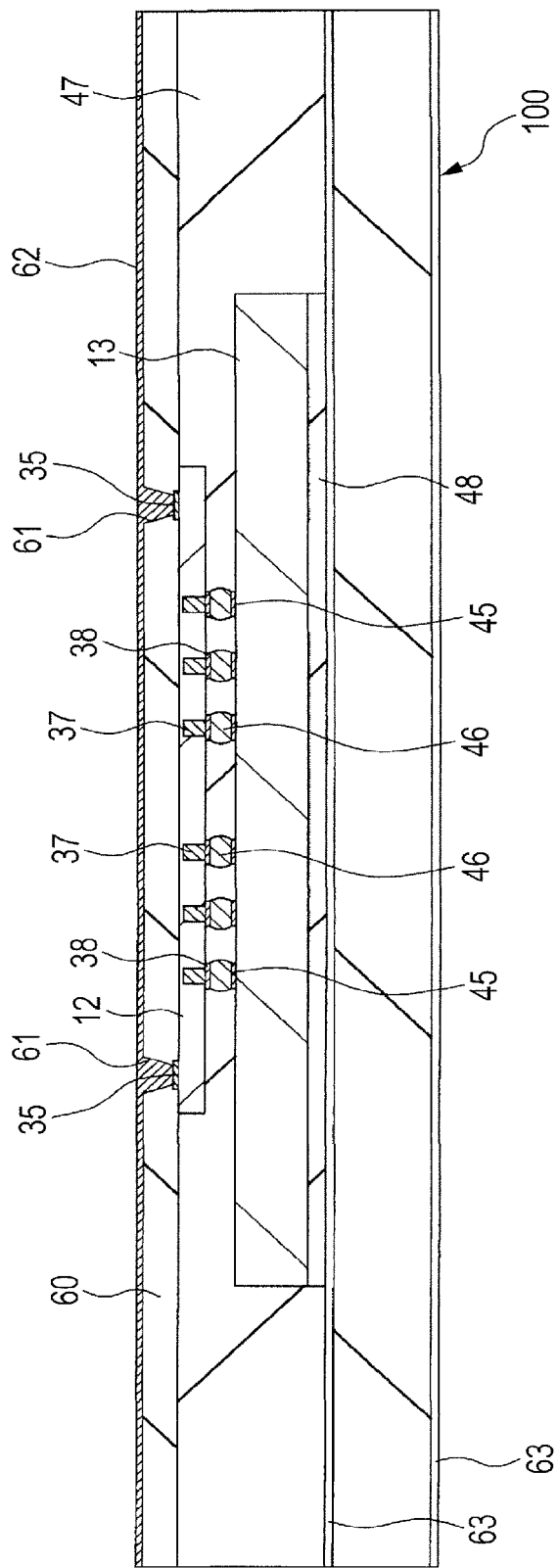
FIG. 32 is a partially-expanded sectional view showing a method of manufacturing a semiconductor device succeeding to FIG. 31.

Successively as shown in FIG. 32, a wiring 62 comprised of copper (Cu) or the like is formed over the surface of the insulating film 60 and inside the openings 61 and the wiring 62 is electrically connected with the main surface pads 35 formed over the main surface of the microcomputer chip 12.

The wiring 62 is formed through the following steps. Firstly, a seed layer comprised of a thin copper (Cu) film is formed over the surface of the insulating film 60 and inside the openings 61 by an electroless plating method or a sputtering method. Successively, after a thick copper (Cu) film is formed over the surface of the seed layer by an electrolytic plating method, the two copper (Cu) films are patterned by etching with a photo resist film as a mask.

Figure 33:
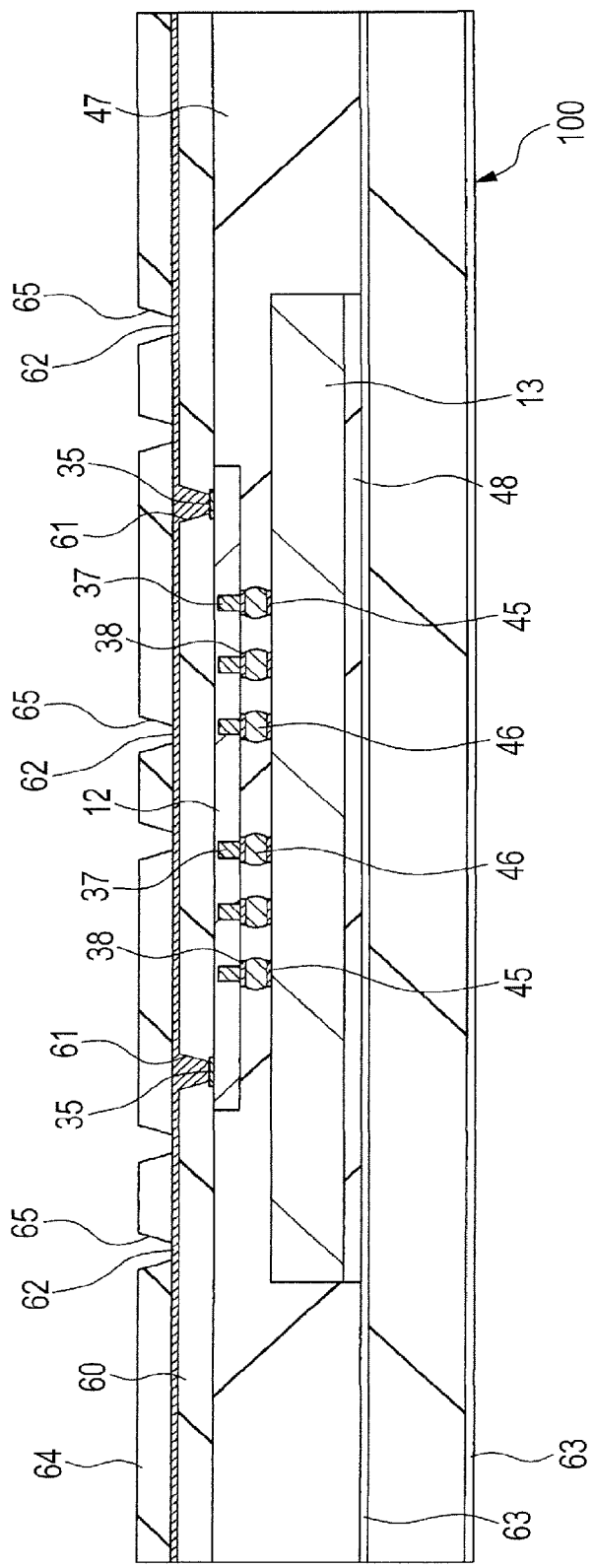
FIG. 33 is a partially-expanded sectional view showing a method of manufacturing a semiconductor device succeeding to FIG. 32.

Successively as shown in FIG. 33, after a secondly-layered insulating film 64 is attached to the whole surface of the insulating film 60 over which the wiring 62 is formed, through-holes (openings) 65 are formed in the insulating film 64 over the wiring 62 by irradiating the insulating film 64 with a user beam for example and the wiring 62 is exposed at the bottoms of the through-holes 65.

Figure 34:
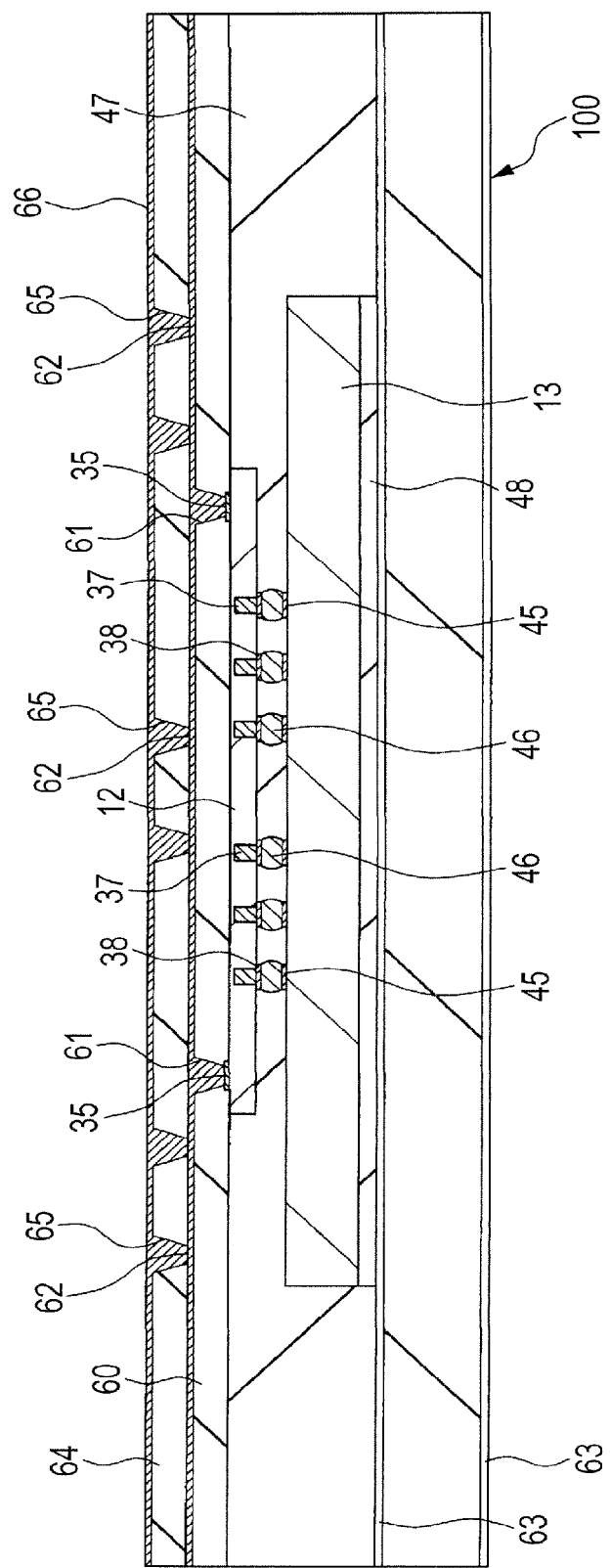
FIG. 34 is a partially-expanded sectional view showing a method of manufacturing a semiconductor device succeeding to FIG. 33.

Successively as shown in FIG. 34, a secondly-layered wiring 66 comprised of a copper (Cu) film is formed over the surface of the secondly-layered insulating film 64 and inside the through-holes 65 and then the secondly-layered wiring 66 is electrically connected with the firstly-layered wiring 62 through the through-holes 65. The secondly-layered wiring 66 can be formed through the same step as the firstly-layered wiring 62.

Figure 35:
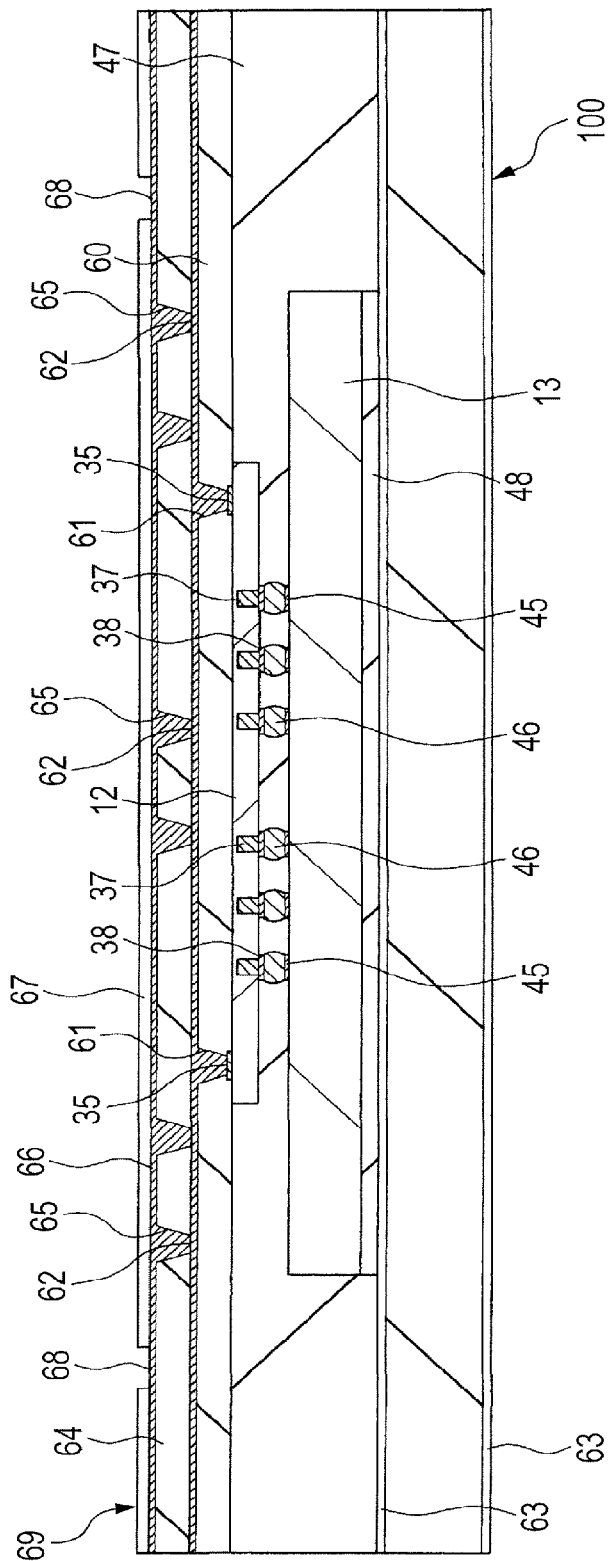
FIG. 35 is a partially-expanded sectional view showing a method of manufacturing a semiconductor device succeeding to FIG. 34.

Successively as shown in FIG. 35, after a solder resist (insulating film) 67 to protect the wiring 66 is formed over the surface of the insulating film 64, a plurality of bump lands (electrode pads) 68 are formed by etching the solder resist 67 and thus exposing parts of the secondly-layered wiring 66. Through the previous steps, a base substrate 69 having two layers of the wirings 62 and 66 is formed over the main surface of the microcomputer chip 12.

Figure 36:
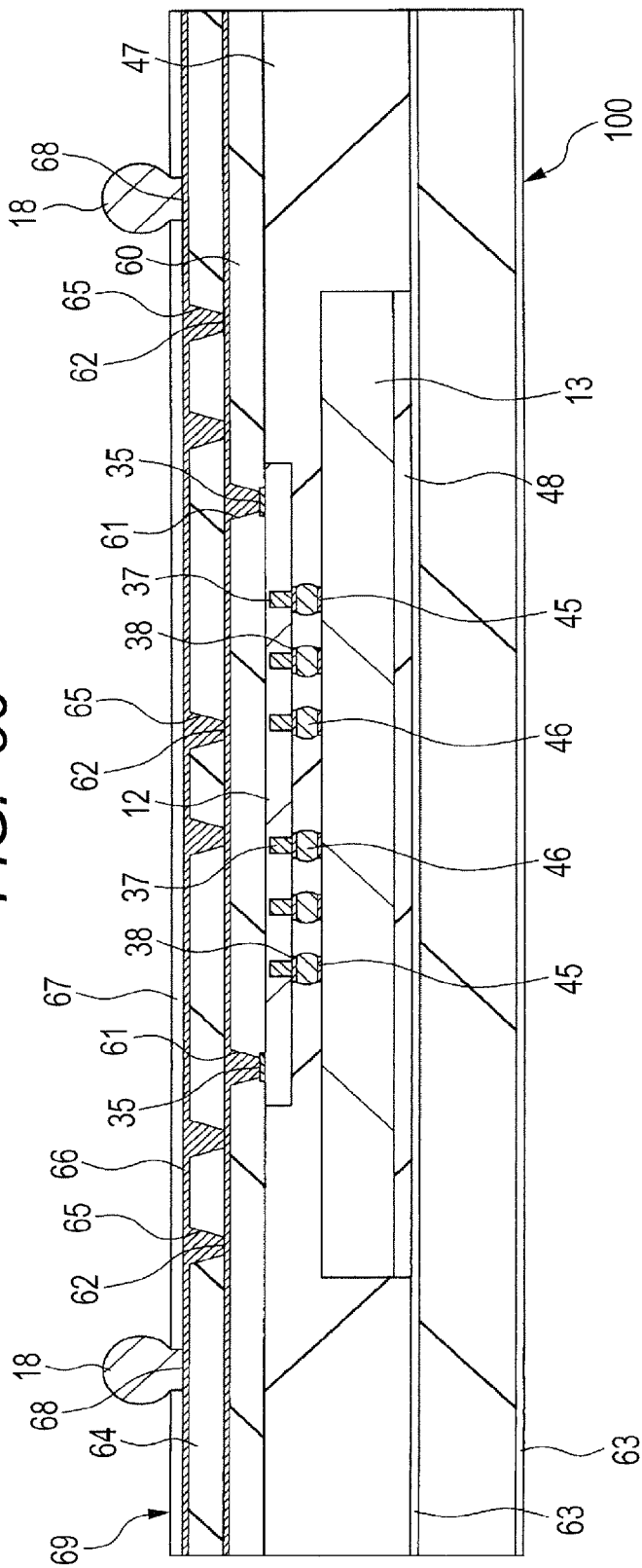
FIG. 36 is a partially-expanded sectional view showing a method of manufacturing a semiconductor device succeeding to FIG. 35.

Successively, after a plated film (not shown in the figures) comprised of a nickel (Ni) film and a gold (Au) film is formed over the surfaces of the bump lands 68 of the base substrate 69, solder balls 18 are coupled to the surfaces of the bump lands 68 as shown in FIG. 36. The solder balls 18 are coupled by the same method as the solder balls 18 of Embodiment 1.

Figure 37:
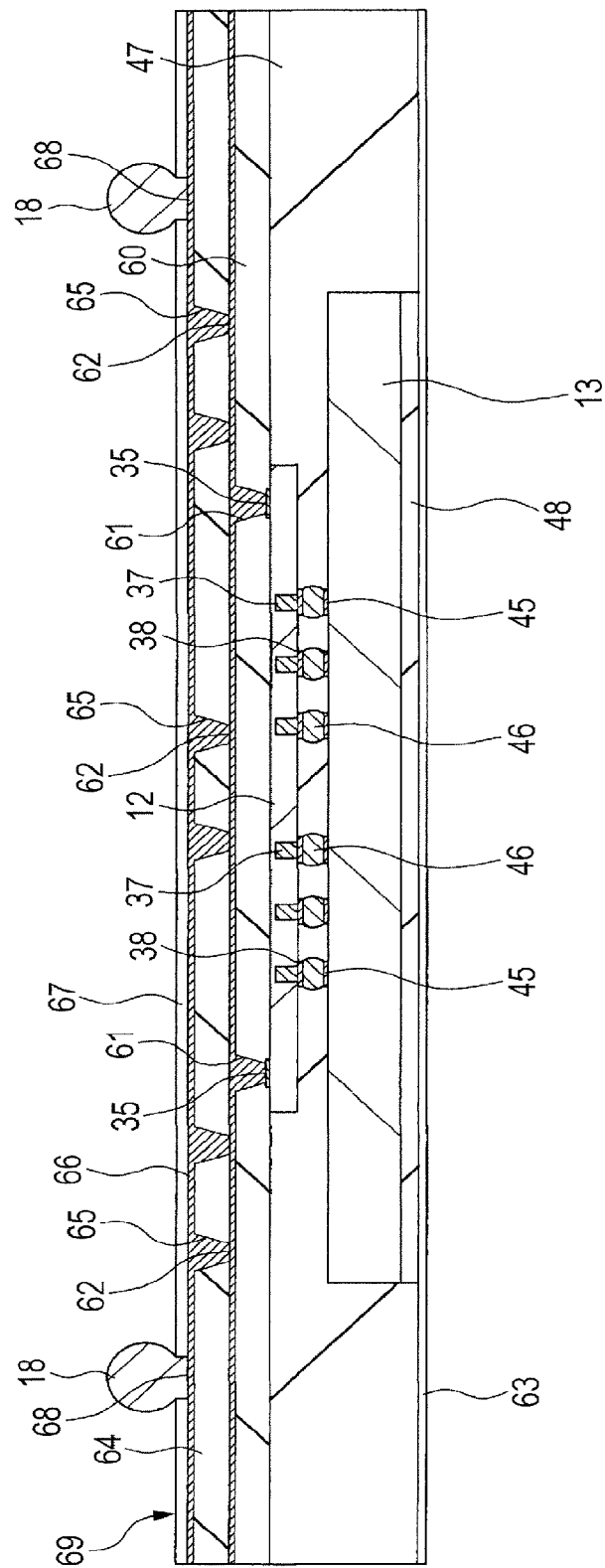
FIG. 37 is a partially-expanded sectional view showing a method of manufacturing a semiconductor device succeeding to FIG. 36.

Successively as shown in FIG. 37, the large substrate 100 which is no longer necessary is removed. On this occasion, the solder resist 63 is left over the back surface of the memory chip 13 in order to shield light and protect the memory chip 13.

Figure 38:
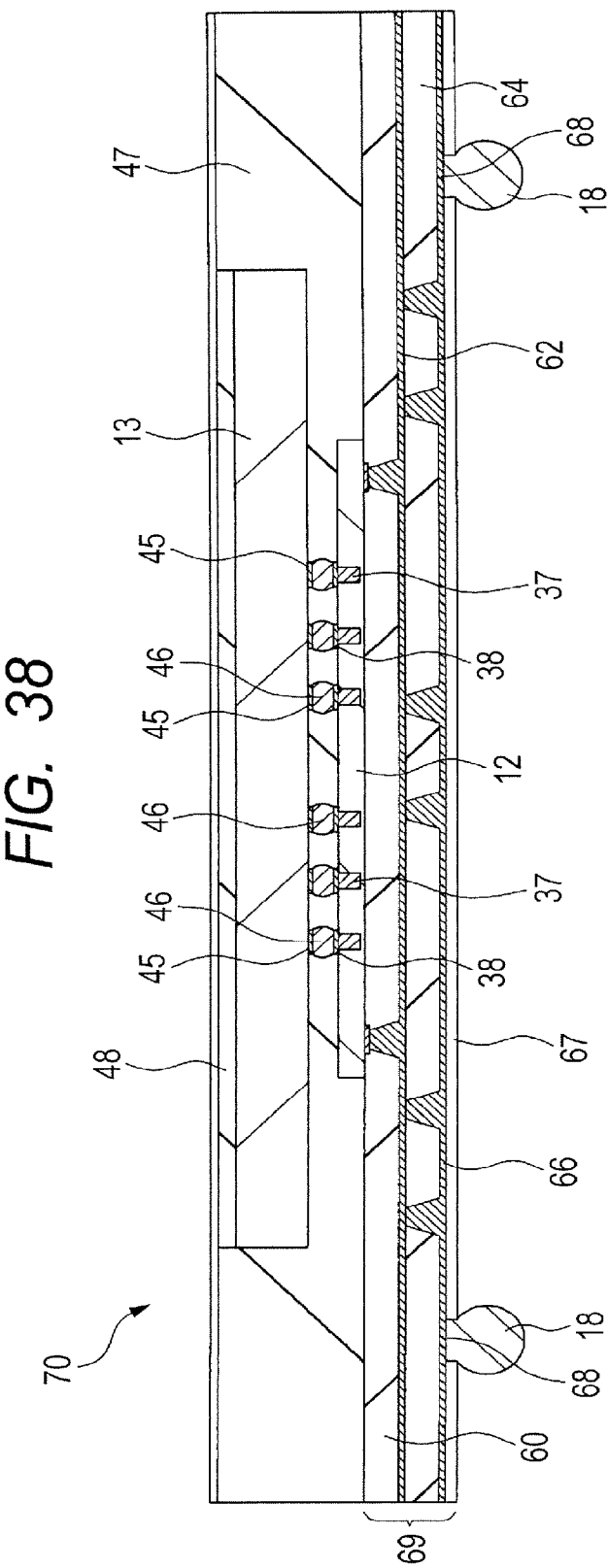
FIG. 38 is a sectional view showing a semiconductor device according to Embodiment 2.

Successively, a semiconductor device 70 according to Embodiment 2 shown in FIG. 38 is completed by cutting the base substrate 69. Here, although the base substrate 69 is cut after the unnecessary large substrate 100 is removed in this case, it is also possible to remove the large substrate 100 from the back surface of the memory chip 13 after the semiconductor device 70 is singulated by cutting the base substrate 69 and the large substrate 100.

By the manufacturing method stated above, it is possible to suppress the inclination and unsteadiness of a microcomputer chip 12 of an upper layer by laminating the microcomputer chip 12 having small external dimensions over a memory chip 13 having large external dimensions. By so doing, an excessive stress is not added to the joint of the microcomputer chip 12 and the memory chip 13 and hence it is possible to: inhibit the deterioration of the reliability of the joint of the microcomputer chip 12 and the memory chip 13 and the occurrence of chip cracks; and improve the reliability and the manufacturing yield of a SIP type semiconductor device 70.

Further, by the manufacturing method stated above, a large substrate 100 which is no longer necessary removed after a ball-mounting step and hence it is possible to materialize a semiconductor device 70 thinner than a semiconductor device 10 of Embodiment 1.

<Modified Example of Embodiment 2>

Figure 39:
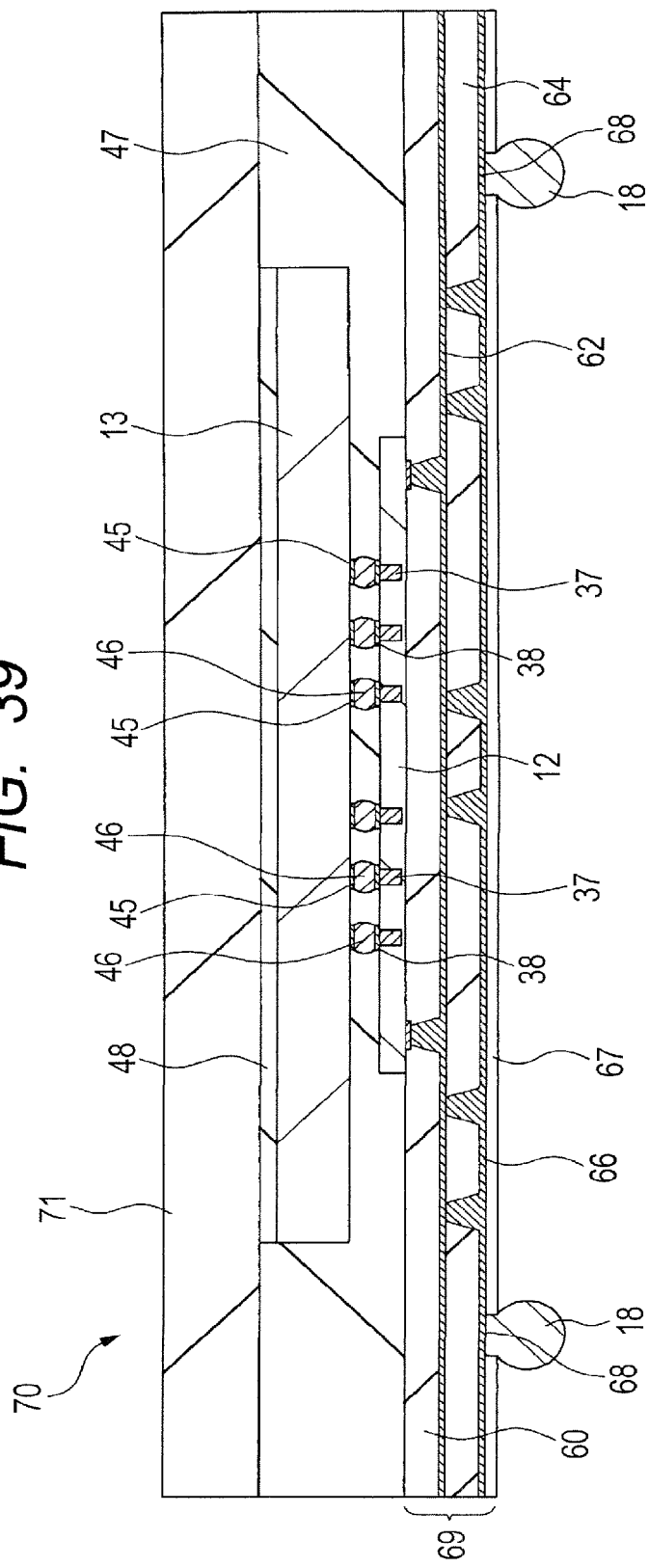
FIG. 39 is a sectional view showing a modified example of a semiconductor device according to Embodiment 2.

Although a large substrate 100 is removed after a ball mounting step in Embodiment 2, a large substrate 100 may remain like in Embodiment 1. On this occasion, a sub-substrate (supporting substrate) 71 obtained by cutting, a large substrate 100 is fixed on the back surface side of a memory chip 13 as shown in FIG. 39 and hence it is 1, possible to improve the mechanical strength of a semiconductor device 70. Here on this occasion since light entering the memory chip 13 is shield with the sub-substrate 71, a black solder resist 63 may not be formed over the surface of the large substrate 100.

Further on this occasion, electronic components can be mounted also over a sub-substrate 71 by forming wiring over the sub-substrate 71 in the same manner as the modified example (FIG. 26 of Embodiment 1 and hence it is possible to increase the mounting density of a semiconductor device 70.

Although the invention established by the present inventors has heretofore been explained concretely on the basis of the embodiments, the present invention is not limited to the embodiments described above and it is a matter of course that the present invention can variously be modified within the range not departing from the tenors of the invention.

MODIFIED EXAMPLE 1

For example, although a so-called BGA (Ball Grid Array) structure obtained by forming solder materials of a ball (spherical) shape (solder balls) over the surfaces of bump lands (electrode pads) of a base substrate as external terminals of a semiconductor device is adopted in Embodiments 1 and 2, a so-called LGA (Land Grid Array) structure obtained by covering the surfaces of bump lands with a small quantity of solder materials instead of the solder balls may also be adopted.

MODIFIED EXAMPLE 2

Further although a semiconductor chip comprised of DRAMs is exemplified as a memory chip in Embodiments 1 and 2, the memory chip may be a semiconductor chip comprised of a flash memory or an SRAM (Static Random Access Memory).

MODIFIED EXAMPLE 3

Further, although a bilayer wiring substrate is exemplified as a base substrate (large wiring substrate) in Embodiments 1 and 2, the base layer may also be a multilayered wiring substrate having four or more wiring layers.

What is claimed is:

1. A semiconductor device, comprising:
  (a) a first substrate having a first surface;
  (b) a first semiconductor chip mounted over said first surface of said first substrate such that a first back surface of said first semiconductor chip faces said first surface of said first substrate,
     wherein said first semiconductor chip has a first main surface opposite to said first back surface, a first main surface pad formed on said first main surface, and a first conductive member formed over said first main surface pad;

(c) a second semiconductor chip mounted over said first main surface of said first semiconductor chip such that a second back surface of said second semiconductor chip faces said first main surface of said first semiconductor chip, said first main surface pad of said first semiconductor chip being electrically connected with a second back surface pad of said second semiconductor chip via said first conductive member, wherein said second semiconductor chip has a second main surface opposite to said second back surface, a second main surface pad formed over said second main surface, and a second conductive member formed over said second main surface pad, wherein said second back surface pad is formed on said second back surface and electrically connected with said second main surface pad, and wherein, in plan view, an area of said second semiconductor chip is smaller than an area of said first semiconductor chip;

(d) a one-piece body of sealing material sealing said first semiconductor chip, said second semiconductor chip, and said second conductive member;

(e) a base substrate mounted directly to said sealing material such that a third surface of said base substrate faces said first surface of said first substrate, a bonding lead formed on said third surface of said base substrate being electrically connected with said second conductive member of said second semiconductor chip, wherein a fourth surface of said base substrate is opposite to said third surface, and wherein a bump land is formed on said fourth surface and electrically connected with said bonding lead; and (f) an external terminal formed on said bump land.

2. The semiconductor device according to claim 1, wherein said sealing material is a non-conductive film or a non-conductive paste.

3. The semiconductor device according to claim 1, wherein said sealing material comprises a thermosetting resin.

4. The semiconductor device according to claim 1, wherein a gap between said first substrate and said second substrate is filled with said sealing material.

5. The semiconductor device according to claim 1, wherein said second back surface pad of said second semiconductor chip is electrically connected with said second main surface pad through a through-via formed in said second semiconductor chip.

6. The semiconductor device according to claim 1, wherein said first semiconductor chip is a memory chip in which memory circuits are formed and said second semiconductor chip is a microcomputer chip in which a control circuit to control said memory circuits of said first semiconductor chip is formed.

7. The semiconductor device according to claim 6, wherein said memory circuits of said first semiconductor chip are DRAM circuits.

8. The semiconductor device according to claim 1,
wherein a wring is formed over said first surface of said first substrate, and
wherein a through-via is formed in said sealing material, and said wiring formed over said first substrate is electrically connected with said bonding lead formed over said base substrate through said through-via.

* * * * *